United States Patent
Kawasaki et al.

(10) Patent No.: US 11,813,686 B2
(45) Date of Patent: Nov. 14, 2023

(54) SOLDER ALLOY, SOLDER PASTE, SOLDER BALL, SOLDER PREFORM, SOLDER JOINT, AND SUBSTRATE

(71) Applicant: SENJU METAL INDUSTRY CO., LTD., Tokyo (JP)

(72) Inventors: Hiroyoshi Kawasaki, Tokyo (JP); Masato Shiratori, Tokyo (JP); Yuji Kawamata, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 17/604,660

(22) PCT Filed: May 15, 2020

(86) PCT No.: PCT/JP2020/019501
§ 371 (c)(1),
(2) Date: Oct. 18, 2021

(87) PCT Pub. No.: WO2020/241317
PCT Pub. Date: Dec. 3, 2020

(65) Prior Publication Data
US 2022/0088723 A1 Mar. 24, 2022

(30) Foreign Application Priority Data
May 27, 2019 (JP) .................................. 2019-098949

(51) Int. Cl.
*B23K 35/26* (2006.01)
*B23K 35/02* (2006.01)
(Continued)

(52) U.S. Cl.
CPC .......... *B23K 35/262* (2013.01); *B23K 35/025* (2013.01); *B23K 35/264* (2013.01);
(Continued)

(58) Field of Classification Search
CPC .................................................... B23K 35/264
See application file for complete search history.

(56) References Cited

U.S. PATENT DOCUMENTS 2,351,477 A * 6/1944 Bouton ................ B23K 35/268
428/645
3,923,501 A * 12/1975 Di Martini ........... B23K 35/268
420/569

(Continued)

FOREIGN PATENT DOCUMENTS

CN       105121677      12/2015
JP       2002-224881    8/2002

(Continued)

OTHER PUBLICATIONS

C. A. MacKay & W. D. von Voss (1985) Effect of compositional changes and impurities on wetting properties of eutectic Sn—Bi alloy used as solder, Materials Science and Technology, 1:3, 240-248, DOI: 10.1179/mst.1985.1.3.240 (Year: 1985).*

(Continued)

*Primary Examiner* — Erin B Saad
*Assistant Examiner* — Carlos J Gamino
(74) *Attorney, Agent, or Firm* — NIXON PEABODY LLP; Jeffrey L. Costellia

(57) ABSTRACT

An object of the present invention is to provide an Sn—Bi—Cu—Ni solder alloy or the like which has a low melting point, excellent ductility, and high tensile strength, and in which if soldering is performed on a Cu electrode subjected to electroless Ni plating treatment, a solder joint formed through this soldering exhibits high shear strength. In addition, another object of the present invention is to provide an Sn—Bi—Cu—Ni solder alloy in which a solder joint formed through soldering exhibits high shear strength even for a Cu electrode which has not been subjected to plating treatment. Furthermore, still another object of the present (Continued)

invention is to provide, in addition to the above-described objects, a solder alloy or the like of which yellowish discoloration can be suppressed and in which change in viscosity of a solder paste over time can be suppressed. The solder alloy has an alloy composition consisting of, by mass %, 31% to 59% of Bi, 0.3% to 1.0% of Cu, 0.01% to 0.06% of Ni, 0.0040% to 0.025% of As, and a balance of Sn.

4 Claims, 6 Drawing Sheets

(51) Int. Cl.
    *C22C 12/00*     (2006.01)
    *C22C 13/02*     (2006.01)
    *H05K 3/34*     (2006.01)
    *B23K 101/36*     (2006.01)

(52) U.S. Cl.
    CPC .............. *C22C 12/00* (2013.01); *C22C 13/02* (2013.01); *H05K 3/3457* (2013.01); *B23K 2101/36* (2018.08)

(56) References Cited

U.S. PATENT DOCUMENTS

| | | | | |
|---|---|---|---|---|
| 5,427,865 | A * | 6/1995 | Mullen, III | B23K 35/262 |
| | | | | 428/548 |
| 5,487,868 | A | 1/1996 | Nishimura | |
| 6,156,132 | A * | 12/2000 | Yamashita | B23K 35/262 |
| | | | | 148/400 |
| 2003/0196732 | A1 * | 10/2003 | Carey | C23C 2/06 |
| | | | | 428/685 |
| 2003/0230361 | A1 * | 12/2003 | Takahashi | B23K 35/264 |
| | | | | 420/561 |
| 2004/0170524 | A1 * | 9/2004 | Lambracht | H01L 24/29 |
| | | | | 420/577 |
| 2012/0313230 | A1 | 12/2012 | Mengal et al. | |
| 2015/0258637 | A1 * | 9/2015 | Asagi | H05K 3/3485 |
| | | | | 420/577 |
| 2016/0074971 | A1 | 3/2016 | Tachibana et al. | |
| 2020/0013564 | A1 * | 1/2020 | I | H01H 1/021 |
| 2022/0090232 | A1 * | 3/2022 | Kawasaki | C22C 13/02 |

FOREIGN PATENT DOCUMENTS

| | | |
|---|---|---|
| JP | A-2012-201942 | 10/2012 |
| JP | 2013-000744 | 1/2013 |
| JP | 2015-098052 | 5/2015 |
| JP | 2015098052 A * | 5/2015 |
| JP | 5807733 | 11/2015 |
| JP | 2016-537206 | 12/2016 |
| WO | WO 03/038417 | 5/2003 |
| WO | WO-2014/170994 | 10/2014 |
| WO | WO-2015/066155 | 5/2015 |
| WO | WO-2019/103025 | 5/2019 |

OTHER PUBLICATIONS

Schmitt-Thomas et al., "Impurities in Solder Baths", Brazing & Soldering, ISSN/ISBN 0263-0060 (Year: 1988).*
International Search Report for PCT/JP2020/019501 dated Aug. 4, 2021 4 pages.
Chinese Search Report (Application No. 202080038895.1), dated Aug. 3, 2022 (9 pages).

* cited by examiner

SOLDER ALLOY, SOLDER PASTE, SOLDER BALL, SOLDER PREFORM, SOLDER JOINT, AND SUBSTRATE

TECHNICAL FIELD

The present invention relates to a solder alloy, a solder paste, a solder ball, a solder preform, a solder joint, and a substrate.

BACKGROUND ART

In recent years, there has been a tendency for electronic devices such as mobile phones to become smaller and thinner. In electronic components of semiconductor devices which are used in such electronic devices, substrates having a thickness reduced from about several mm to 1 mm or less have been used.

As solder alloys electrically joining electronic components to substrates, Sn—Ag—Cu solder alloys have been widely used in the related art. Sn—Ag—Cu solder alloys have a relatively high melting point, and even Sn—3Ag—0.5Cu solder alloys having a eutectic composition have a melting point of about 220° C. For this reason, if electrodes of the above-described thin substrates are soldered with Sn—Ag—Cu solder alloys, in some cases, the substrates may be distorted due to heat during joining and joining failure may occur.

Regarding such connection failure, it is necessary to improve connection reliability by suppressing distortion of thin substrates by performing the soldering at a low temperature. Sn—58Bi solder alloys are known as low-melting point solder alloys that can cope with this. Since these solder alloys have a considerably low melting point of about 140° C., distortion of substrates can be suppressed.

However, Bi is inherently a brittle element, and Sn—Bi solder alloys are also brittle. Even if the amount of Bi in an Sn—Bi solder alloy is reduced, the Sn—Bi solder alloy is embrittled due to segregation of Bi in Sn. There is a concern that if stress is applied to a solder joint soldered with an Sn—Bi solder alloy, cracks may occur due to the brittleness thereof and the mechanical strength may deteriorate.

In addition, as the size of electronic devices becomes smaller, the area of substrates used therefor becomes smaller. Therefore, miniaturization of electrodes or pitch reduction between electrodes needs to be realized. Furthermore, since the amount of a solder alloy used for soldering is reduced, there is a concern that the mechanical strength of a solder joint may be decreased.

Patent Document 1 discloses an Sn—Bi—Cu—Ni solder alloy obtained by adding Cu and Ni to an Sn—Bi solder alloy in order to enable solder joining with a high joining strength. According to the literature, since intermetallic compounds having a hexagonal close-packed structure formed in the solder joint portion and/or a solder joint interface are formed in the joint portion in which this solder alloy is used, the joining strength improves.

Here, if the surface of the above-described solder alloy having a large amount of Sn is oxidized, an SnO coating film, which is an oxide film, is formed, and the surface thereof turns yellow. The thicker the film thickness of the SnO coating film, the greater the yellowness of the surface of the solder. If the surface of a solder alloy turns yellow and loses its metallic luster, the solder alloy is not detected during automatic processing of image recognition of the solder alloy. Therefore, in some cases, a solder alloy that actually exists is not recognized.

Regarding solder materials of which yellowish discoloration of surfaces thereof is suppressed in the related art, Patent Document 2 discloses, for example, a solder material, which is a sphere having a diameter of 1 to 1,000 μm, including: a solder layer consisting of a metallic material made of an alloy containing 40 mass % or more of Sn or a metallic material containing 100 mass % of Sn; and a coating layer that covers the surface of the solder layer, in which, in the coating layer, an SnO film is formed outside the solder layer and an $SnO_2$ film is formed outside the SnO film, and the thickness of the coating layer is greater than 0 nm and less than or equal to 4.5 nm. The solder material suppresses yellowish discoloration of the surface of the solder material through formation of an $SnO_2$ film.

CITATION LIST

Patent Literature

Patent Document 1

Japanese Unexamined Patent Application, First Publication No. 2013-000744

Patent Document 2

Japanese Patent No. 5807733

SUMMARY OF INVENTION

Technical Problem

Electrodes of electronic components are usually Cu, and such Cu electrodes are generally coated with electroless Ni plating, electroless Ni/Au plating, or electroless Ni/Pd/Au plating. In this manner, Cu electrodes are subjected to electroless plating treatment with noble metals such as Au or Pd. Au plating suppresses oxidation of underlying Ni plating and improves wettability with respect to molten solder. Electroless Ni plating forms Ni plating containing a considerable amount of P derived from a reducing agent (for example, sodium hypophosphate) used for electroless plating. Such Ni plating contains at least several mass % of P, for example, 2 to 15 mass %.

However, there is a disclosure in Patent Document 1 that Cu or Ni is added to Sn—Bi solder alloys so as to form intermetallic compounds having a hexagonal close-packed structure at a joining interface between the solder alloy and Cu wiring portions drawn from electrodes, but there is no disclosure of a specific alloy composition. There is also no disclosure of results to prove an effect of high shear strength. Although it is disclosed in the literature that a predetermined amount of Cu or Ni is included in an alloy composition with 57 atm % of Sn and 43 atm % of Bi, there is no disclosure of examples. Therefore, it is unclear whether the shear strength improves in this composition.

In addition, it is disclosed in this literature that the joining object with respect to the solder alloy is a Cu wiring portion of a printed circuit board or a wiring portion containing no Cu. However, except for the fact that the wiring portion is Cu, it is unclear what kind of configuration the joining object has. There is no disclosure of a specific alloy composition of the solder alloys in the literature, and there is neither disclosure nor suggestion of the state of a joining interface except that intermetallic compounds are formed at a joining interface between electrodes and the solder alloy. Accordingly, it would not be expected that it would be possible to solve the following problems in a case where any of the solder alloys satisfying having the contents of Bi, Cu, and Ni disclosed in the literature were used for soldering of Cu electrodes subjected to electroless Ni plating treatment, for example.

If soldering is performed on an electrode subjected to electroless Ni plating treatment, since the diffusion coefficient of Ni in a solder alloy is larger than the diffusion coefficient of P, Ni preferentially diffuses into the solder alloy and a P-rich layer having a relatively high concentration of P is formed at a joining interface between the solder alloy and the electrode. Since this P-rich layer is hard and brittle, the shear strength of a solder joint deteriorates. When a solder joint having such a P-rich layer breaks due to shearing, a phenomenon occurs in which an Ni plating layer is exposed. This breakage is not caused by the solder joint itself, but is rather caused by peeling-off of the P-rich layer formed on the electrode. Accordingly, the formation of the P-rich layer adversely affects the connection reliability of the solder joint.

Similarly, even in a case where soldering is performed on Cu electrodes which have not been subjected to plating treatment, it is unclear whether or not all the solder alloys satisfying having the ranges of the contents of the elements disclosed in the literature would exhibit high shear strength.

Furthermore, the effect of suppressing yellowish discoloration of the surface of solder alloys is an important factor in the automatic processing of image recognition of solder alloys. However, since the solder material disclosed in Patent Document 2 forms an $SnO_2$ film, high-energy plasma irradiation or the like is required, which complicates the production process.

In addition, in joining to and assembling of electronic components on substrates of electronic devices, soldering using a solder paste is advantageous in terms of costs and reliability. Coating of a substrate with a solder paste is performed, for example, through screen printing using a metal mask. In order to secure printability of a solder paste, it is necessary for the viscosity of the solder paste to be appropriate.

Here, in a case where a solder powder in which yellowish discoloration is suppressed is used, it is possible to increase the amount of an activator used in a solder paste or to use a highly active one in order to improve the wettability. However, if the wettability is improved with an activator or the like, the viscosity of a solder paste increases over time. For this reason, in the solder alloy in the related art, it is impossible to have a required thickening suppression effect when used in a solder paste at the same time as the effect regarding suppressing yellowish discoloration, and further research thereon is required.

In addition to these, in a case of forming a solder joint on an electrode of a thin substrate, if the melting point is high, the substrate at the time of heating may be distorted. In addition, even with slight distortion of a substrate, if the ductility of a solder alloy is low, stress may be concentrated on the substrate side and the substrate may be damaged. Furthermore, when a solder joint is sheared, if the strength of a solder alloy itself is low, the solder alloy may break due to the shearing.

An object of the present invention is to provide an Sn—Bi—Cu—Ni solder alloy which has a low melting point, excellent ductility, and high tensile strength, and in which if soldering is performed on a Cu electrode subjected to electroless Ni plating treatment, a solder joint formed through this soldering exhibits high shear strength. In addition, another object of the present invention is to provide an Sn—Bi—Cu—Ni solder alloy in which a solder joint formed through soldering exhibits high shear strength even for a Cu electrode which has not been subjected to plating treatment. Furthermore, still another object of the present invention is to provide, in addition to the above-described objects, a solder alloy of which yellowish discoloration can be suppressed and in which change in viscosity of a solder paste over time can be suppressed. In addition to these, still another object is to provide: a solder paste, a resin-containing solder, a solder ball, and a solder preform in which the above-described solder alloy is used; a solder joint formed using these; and a substrate which includes this solder joint.

Solution to Problem

If a Cu electrode is subjected to electroless Ni plating treatment, a P-containing Ni plating layer is formed. The present inventors have focused on the fact that the diffusion coefficient of Ni in a solder alloy is larger than that of P to increase the shear strength of a solder joint formed on this electrode. The present inventors have postulated that it is possible to suppress the growth of a P-rich layer by suppressing the diffusion of Ni in a solder alloy during soldering, and have conducted extensive studies to increase the shear strength.

First, the present inventors have found that the shear strength of a solder joint deteriorates as a result of adding only about 0.5 mass % of Cu to an Sn—Bi solder alloy and soldering a Cu electrode having an electroless Ni plating layer. It has been found that even if the amount of Cu is increased to 1.1 mass % in this Sn—Bi—Cu solder alloy, the shear strength does not improve, the melting point is high, and the ductility significantly deteriorates. That is, the present inventors have found that even if a Sn—Bi solder alloy contains only Cu, the shear strength of a formed solder joint cannot be increased, and there are problems such as a high melting point or low ductility depending on the amount of Cu.

Therefore, the present inventors have focused on the amount of Cu in an Sn—Bi solder alloy and Ni which forms a complete solid solution with Cu and have precisely investigated the amount of Ni based on the above-described findings in the case where only Cu is included. As a result, the present inventors have found that in a case where Cu and Ni are in predetermined amounts, the melting point of a solder alloy is low, the ductility is excellent, the tensile strength is high, the growth of a P-rich layer is suppressed, and the shear strength of a solder joint formed on a Cu electrode having an electroless Ni plating layer significantly improves. Accordingly, the present inventors have found that even if a thin substrate is used, the distortion of the substrate during soldering is suppressed and excellent connection reliability is exhibited. Furthermore, in order to confirm versatility, the present inventors have found that a solder joint formed on a Cu electrode having no electroless Ni plating layer exhibits high shear strength similarly to the solder joint formed on a Cu electrode having an electroless Ni plating layer.

In addition to this, the present inventors have attempted to intentionally add, as an element suppressing yellowish discoloration, a trace amount of As out of various elements to an Sn—Bi—Cu—Ni solder alloy having the above-described excellent tensile strength, ductility, and shear strength. A solder alloy containing a high Sn content is known to form an $SnO_2$ film as described above, and a solder alloy containing As is usually considered to be inferior in wettability. However, unexpectedly, the present inventors have found that, in addition to the above-described findings, in an Sn—Bi—Cu—Ni—As solder alloy containing As, the yellowish discoloration is suppressed and an excellent thickening suppression effect is obtained due to formation of an As-concentrated layer on the surface of the solder alloy, and have thus realized the present invention.

Here, the present invention is as follows.

(1) A solder alloy having an alloy composition consisting of, by mass %, 31% to 59% of Bi, 0.3% to 1.0% of Cu, 0.01% to 0.06% of Ni, 0.0040% to 0.025% of As, and a balance of Sn, the solder alloy including: an As-concentrated layer, in which the presence of the As-concentrated layer is confirmed by determination criteria as below, the As-concentrated layer is a region from an outermost surface of the solder alloy to a depth of 2×D1 (nm) in terms of $SiO_2$, and a thickness of the As-concentrated layer in terms of $SiO_2$ is 0.5 to 8.0 nm.

(Determination Criteria)

In a sample having a size of 5.0 mm×5.0 mm, an arbitrary area of 700 μm×300 μm is selected, and an XPS analysis is performed in combination with ion sputtering. One area is selected for each sample, and each of three samples is analyzed once, for a total of three analyses. In a case where S1>S2 in all of the three analyses, it is determined that an As-concentrated layer has been formed.

Here,

S1: Integrated value of a detection intensity of As in a region from a depth of 0 to 2×D1 (nm) in terms of $SiO_2$ in a chart of XPS analysis S2: Integrated value of a detection intensity of As in a region from a depth of 2×D1 to 4×D1 (nm) in terms of $SiO_2$ in a chart of XPS analysis D1: Initial depth (nm) in terms of $SiO_2$ at which a detection intensity of O atoms is ½ a maximum detection intensity (intensity at Do·max) in a portion deeper than the depth (Do·max (nm)) in terms of $SiO_2$ at which the detection intensity of O atoms is the maximum in a chart of XPS analysis (2) The solder alloy according to any one of the above-described (1), in which the alloy composition further includes, by mass %, at least one of P and Ge in a total amount of 0.003% to 0.05%.

(3) A solder paste including: a solder powder consisting of the solder alloy according to the above-described (1) or (2); and a flux.

(4) A solder ball consisting of the solder alloy according to the above-described (1) or (2).

(5) A solder preform consisting of the solder alloy according to the above-described (1) or (2).

(6) A solder joint formed from the solder alloy according to the above-described (1) or (2) on a Cu electrode having an Ni plating layer.

(7) The solder joint according to the above-described (6), in which the Ni plating layer is an electroless plating layer containing P.

(8) A substrate including: at least one Cu electrode having an Ni plating layer; and a solder joint formed from the solder alloy according to the above-described (1) or (2) on each of the Cu electrodes, in which the thickness of the substrate is less than or equal to 5 mm.

(9) The substrate according to the above-described (8), in which the Ni plating layer contains P.

DESCRIPTION OF EMBODIMENTS

Figure 1:
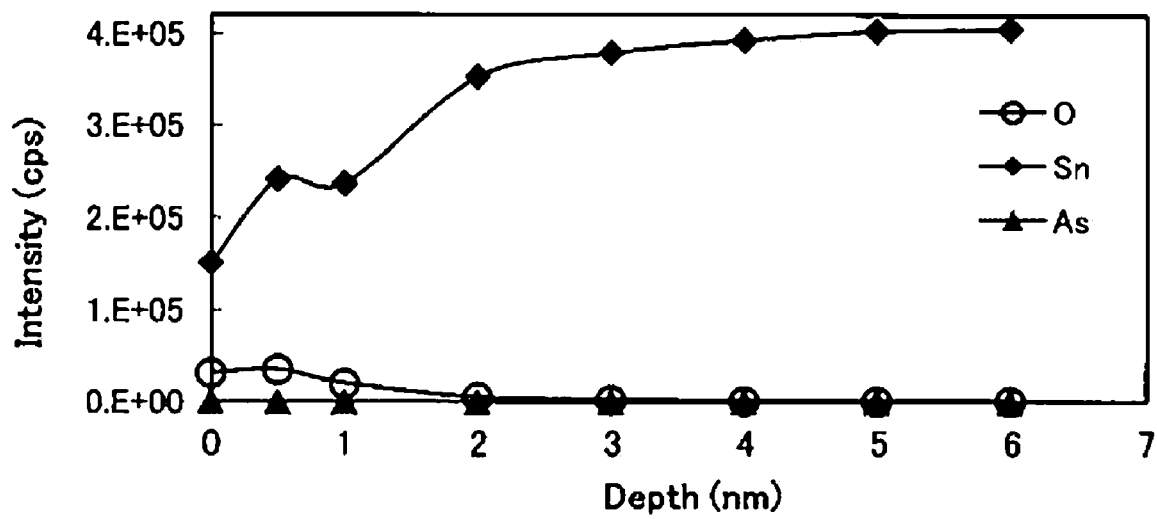
FIG. 1 is a chart of XPS analysis of a surface of a solder ball.

The present invention will be described in more detail below. In the following description, "%" relating to a solder alloy composition is "mass %" unless otherwise specified.

1. Solder Alloy

The solder alloy according to the present invention is an Sn—Bi—Cu—Ni—As solder alloy containing Cu, Ni, and As. Since Cu forms a complete solid solution with Ni, the solubility of Cu and Ni is low in the solder alloy according to the present invention containing Cu and Ni, and diffusion of Cu or Ni from an electrode into the solder alloy can be suppressed. Then, the growth of a P-rich layer formed on an electroless Ni plating layer can be suppressed by the suppression of the diffusion of Ni. Here, it is thought that the diffusion of Cu and Ni can be suppressed due to an Sn—Bi solder alloy containing only Cu in a large amount.

However, simply by increasing the amount of Cu, the amount of Cu—Sn compounds at a joining interface with an electrode and in a solder alloy increases. Therefore, the shear strength deteriorates, the melting point of a solder alloy itself increases, and the ductility deteriorates. Accordingly, an Sn—Bi—Cu solder alloy cannot be used for soldering a Cu electrode having an electroless Ni plating layer.

Here, examples of elements that reduce the solubility of Ni without increasing the amount of Cu include Ni. A solder alloy containing a trace amount of Ni has a low melting point and high ductility. For this reason, in a case where an electrode is subjected to electroless Ni plating treatment, the growth of a brittle P-rich layer can be suppressed by suppressing the diffusion of Ni into a solder alloy, and the shear strength of a solder joint can be greatly improved.

Furthermore, since the solder alloy according to the present invention contains a predetermined amount of Cu and Ni, the solubility of Cu is low. Even for a Cu electrode having no electroless Ni plating layer, if the suppression of the diffusion of Cu into a solder alloy is suppressed, excessive formation of brittle Sn—Cu compounds formed at a joining interface and in a solder alloy is suppressed. Therefore, the shear strength of a solder joint improves. As a result, in the present invention, regardless of whether or not plating treatment is performed on a Cu electrode, excellent connection reliability can be secured by suppressing distortion of a thin substrate during soldering.

In general, Au plating or plating layers of noble metals such as Pd and Au or alloys thereof are formed on an electroless Ni plating layer. An Au plating layer is formed on an Ni plating layer. However, the Au plating layer has a significantly thin film thickness of about 0.05 μm, and therefore disappears during soldering due to diffusion into a solder alloy. Accordingly, when various characteristics are evaluated in the present invention, it is unnecessary to particularly consider the Au plating layer or plating layers of other noble metals.

In the present invention, the reason for limiting the alloy composition of a solder alloy is as follows.

(1) Bi: 31% to 59%

Bi lowers the melting point of a solder alloy. If the amount of Bi is less than 31%, the melting point increases and a substrate is distorted during soldering. The lower limit of the amount of Bi is greater than or equal to 31%, preferably greater than or equal to 32%, and more preferably greater than or equal to 35%. On the other hand, if the amount of Bi is higher than 59%, the tensile strength and the ductility deteriorate due to precipitation of Bi. The upper limit of the amount of Bi is less than or equal to 59%, preferably less than or equal to 58%, more preferably less than or equal to 45%, and particularly preferably less than or equal to 40%.

(2) Cu: 0.3% to 1.0%

Cu suppresses the diffusion of Ni in an electroless Ni plating layer into a solder alloy and suppresses the growth of a P-rich layer formed on an interface between the Ni plating layer and a solder joint portion. In addition, since the diffusion of Cu is suppressed, excessive formation of brittle Sn—Cu compounds formed at a joining interface between a solder alloy and a Cu electrode which has not been subjected to electroless Ni plating treatment and in the solder alloy is suppressed. Therefore, the shear strength of a solder joint improves.

If the amount of Cu is less than 0.3%, excessive formation of a P-rich layer or Sn—Cu compounds cannot be suppressed, and the shear strength deteriorates. The lower limit of the amount of Cu is greater than or equal to 0.3% and preferably greater than or equal to 0.4%. On the other hand, if the amount of Cu is greater than 1.0%, intermetallic compounds with Sn are excessively formed in a solder alloy, and therefore, the ductility of the solder alloy decreases. In addition, the melting point of the solder alloy significantly increases, and the wettability of the solder alloy decreases. Furthermore, the workability deteriorates due to generation of distortion of a substrate. The upper limit of the amount of Cu is less than or equal to 1.0%, preferably less than or equal to 0.8%, and more preferably less than or equal to 0.7%.

(3) Ni: 0.01% to 0.06%

Ni promotes the effect of Cu which suppresses diffusion of Ni, and suppresses the growth of a P-rich layer to further improve the shear strength. If the amount of Ni is less than 0.01%, the shear strength cannot be improved. The lower limit of the amount of Ni is greater than or equal to 0.01% and preferably greater than or equal to 0.02%. On the other hand, if the amount of Ni is greater than 0.06%, a compound of Sn and Ni is excessively formed in a solder alloy, and therefore, the ductility decreases. The upper limit of the amount of Ni is less than or equal to 0.06%, preferably less than or equal to 0.05%, and more preferably less than or equal to 0.04%.

(4) As: 0.0040% to 0.025%

Since As forms an As-concentrated layer on the surface of a solder alloy, the yellowish discoloration is suppressed. In addition, if the solder alloy according to the present invention is added to a solder paste as a solder powder, the thickening suppression effect can be exhibited. The amount of As needs to be greater than or equal to 0.0040% with regard to a lower limit thereof in order for the effects due to inclusion of As to be exhibited sufficiently. On the other hand, if the amount of As is greater than 0.025%, the wettability deteriorates. The upper limit of the amount of As is less than or equal to 0.025%, preferably less than or equal to 0.020%, and more preferably less than or equal to 0.010%.

The As-concentrated layer formed due to incorporation of As in the present invention is a region in which the concentration of As is higher than the average concentration (proportion of the mass of As in the mass of a solder alloy) of As in a solder material, and is specifically a region from the outermost surface of a solder alloy to a depth of 2×D1 (nm) in terms of $SiO_2$. The presence of the As-concentrated layer can be confirmed by determination criteria described below. The As-concentrated layer is preferably present on at least a part of the surface side of a solder alloy and preferably covers the entire surface.

If an As-concentrated layer is formed due to incorporation of As as in the present invention, the yellowish discoloration is suppressed and the change in viscosity of a solder paste over time can be suppressed. Although the reason for this is unclear, it is inferred to be as follows. It is thought that the increase in the viscosity is caused by formation of salts due to a reaction caused between Sn or an Sn oxide and various additives such as an activator contained in a solder paste (flux) or coagulation of a solder powder. It is inferred that, if an As-concentrated layer is present on the surface of the solder alloy according to the present invention, the As-concentrated layer is interposed between a solder powder and a flux, and the above-described reaction is unlikely to occur, and therefore, the above-described effects are simultaneously exhibited.

(4-1) Determination Criteria of As-Concentrated Layer

In a sample having a size of 5.0 mm×5.0 mm (in a case where a solder material is not plate-shaped, one obtained by spreading a solder material (such as a solder powder or a solder ball) without any gaps over a range of 5.0 mm×5.0 mm), an arbitrary area of 700 μm×300 μm is selected, and XPS analysis is performed in combination with ion sputtering. One area is selected for each sample, and each of three samples is analyzed once, for a total of three analyses. In a case where S1≥S2 in all of the three analyses, it is determined that an As-concentrated layer has been formed.

Here, the definition of S1, S2, and D1 is as follows.

S1: Integrated value of a detection intensity of As in a region from a depth of 0 to 2×D1 (nm) in terms of $SiO_2$ in a chart of XPS analysis performed on the above-described sample S2: Integrated value of a detection intensity of As in a region from a depth of 2×D1 to 4×D1 (nm) in terms of $SiO_2$ in a chart of XPS analysis D1: Initial depth (nm) in terms of $SiO_2$ at which a detection intensity of O atoms is ½ a maximum detection intensity (intensity at Do·max) in portion deeper than the depth (Do·max (nm)) in terms of $SiO_2$ at which a detection intensity of O atoms is a maximum in a chart of XPS analysis The detailed conditions of the above-described determination criteria of the As-concentrated layer follow the description of examples. By having an As-concentrated layer on the surface of the solder alloy according to the present invention, the yellowish discoloration of the solder alloy can be suppressed and the increase in the viscosity of a solder paste can be suppressed.

(4-2) Thickness of As-Concentrated Layer

The thickness (in terms of $SiO_2$) of an As-concentrated layer is 0.5 to 8.0 nm, more preferably 0.5 to 4.0 nm, and most preferably 0.5 to 2.0 nm. If the thickness of an As-concentrated layer is within the above-described ranges, a solder material of which the yellowish discoloration is suppressed and which has excellent wettability is obtained.

(4-3) Yellowness

In the present invention, yellowness b* in the L*a*b* color system of a solder alloy is preferably 0 to 10.0, more preferably 3.0 to 5.7, and most preferably 3.0 to 5.0. If the yellowness b* in the L*a*b* color system of a solder material is within the above-described ranges, the yellowness is low and the solder has metallic luster. Therefore, a solder joint is accurately detected during automatic processing of image recognition of the solder joint.

In the present invention, the yellowness b* can be obtained from color values (L*, a*, b*) by measuring spectral transmittance according to "Methods of Color Measurement-Color of Reflecting and Transmitting Objects" of JIS Z 8722:2009 with a light source D65 and a 10-degree field of view using a CM-3500d2600d-type spectrocolorimeter (manufactured by Konica Minolta, Inc.)

(5) Total Amount of 0.003% to 0.05% of at Least One of P and Ge

The solder alloy according to the present invention may contain, as arbitrary elements, at least one of P and Ge in a total amount of 0.003% to 0.05%. These elements can suppress the growth of a P-rich layer to increase the shear strength of a solder joint and can prevent yellowish discoloration of a solder alloy in cooperation with As.

From such a viewpoint, the solder alloy according to the present invention preferably contains P and more preferably contains P and Ge. The amount of P is preferably 0.001% to 0.03% and more preferably 0.01% to 0.07%. The amount of Ge is preferably 0.001% to 0.03% and more preferably 0.01% to 0.03%.

(6) Balance: Sn

The balance of the solder alloy according to the present invention is Sn. The solder alloy may contain unavoidable impurities in addition to the above-described elements. The inclusion of unavoidable impurities does not affect the above-described effects.

In the solder alloy according to the present invention, even if a solder joint is sheared, no electroless Ni plating layer of an electrode is exposed. This is because the solder according to the present invention can suppress the diffusion of Ni into an electroless Ni plating layer and the growth of a P-rich layer formed on the surface of a plating layer, as described above. As a result, in the solder alloy according to the present invention, the mechanical properties, particularly the shear strength, at a joint portion interface are significantly improved. At the same time, the yellowish discoloration of the solder alloy and the change in viscosity of a solder paste over time can be suppressed.

2. Solder Paste

The solder paste according to the present invention contains a flux and a solder powder.

(1) Component of Flux

A flux used in the solder paste is composed of any one or a combination of two or more of an organic acid, an amine, an amine hydrohalide, an organic halogen compound, a thixotropic agent, rosin, a solvent, a surfactant, a base agent, a polymer compound, a silane coupling agent, and a colorant.

Examples of organic acids include succinic acid, glutaric acid, adipic acid, pimelic acid, suberic acid, azelaic acid, sebacic acid, dimer acids, propionic acid, 2,2-bishydroxymethylpropionic acid, tartaric acid, malic acid, glycolic acid, diglycolic acid, thioglycolic acid, dithioglycolic acid, stearic acid, 12-hydroxystearic acid, palmitic acid, and oleic acid.

Examples of amines include ethylamine, triethylamine, ethylenediamine, triethylenetetramine, 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine-isocyanuric acid adduct, a 2-phenylimidazole-isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, 2-phenylimidazoline, 2,4-diamino-6-vinyl-s-triazine, a 2,4-diamino-6-vinyl-s-triazine-isocyanuric acid adduct, 2,4-diamino-6-methacryloyloxyethyl-s-triazine, an epoxy-imidazole adduct, 2-methylbenzimidazole, 2-octylbenzimidazole, 2-pentylbenzimidazole, 2-(1-ethylpentyl)benzimidazole, 2-nonylbenzimidazole, 2-(4-thiazolyl) benzimidazole, benzimidazole, 2-(2'-hydroxy-5'-methylphenyl) benzotriazole, 2-(2'-hydroxy-3'-tert-butyl-5'-methylphenyl)-5-chlorobenzotriazole, 2-(2'-hydroxy-3',5'-di-tert-amylphenyl) benzotriazole, 2-(2'-hydroxy-5'-tert-octylphenyl) benzotriazole, 2,2'-methylenebis[6-(2H-benzotriazole-2-yl)-4-tert-octylphenol], 6-(2-benzotriazolyl)-4-tert-octyl-6'-tert-butyl-4'-methyl-2,2'-methylenebisphenol, 1,2,3-benzotriazole, 1-[N,N-bis(2-ethylhexyl) aminomethyl] benzotriazole, carboxybenzotriazole, 1-[N,N-bis(2-ethylhexyl) aminomethyl]methylbenzotriazole, 2,2'-[[(methyl-1H-benzotriazole-1-yl)methyl]imino]bisethanol, 1-(1',2'-dicarboxyethyl) benzotriazole, 1-(2,3-dicarboxypropyl) benzotriazole, 1-[(2-ethylhexyl amino)methyl]benzotriazole, 2,6-bis[(1H-benzotriazole-1-yl) methyl]-4-methylphenol, 5-methylbenzotriazole, and 5-phenyltetrazole.

An amine hydrohalide is a compound obtained by reacting an amine and a hydrogen halide, and examples of amines include ethylamine, ethylenediamine, triethylamine, diphenylguanidine, ditolylguanidine, methylimidazole, and 2-ethyl-4-methylimidazole, and examples of hydrogen halides include hydrides of chlorine, bromine, and iodine.

Examples of organic halogen compounds include trans-2,3-dibromo-2-butene-1,4-diol, triallyl isocyanurate hexabromide, 1-bromo-2-butanol, 1-bromo-2-propanol, 3-bromo-1-propanol, 3-bromo-1,2-propanediol, 1,4-dibromo-2-butanol, 1,3-dibromo-2-propanol, 2,3-dibromo-1-propanol, 2,3-dibromo-1,4-butanediol, and 2,3-dibromo-2-butene-1,4-diol.

Examples of thixotropic agents include a wax-based thixotropic agent, an amide-based thixotropic agent, and a sorbitol-based thixotropic agent. Examples of wax-based thixotropic agents include hydrogenated castor oil. Examples of amide-based thixotropic agents include a monoamide-based thixotropic agent, a bisamide-based thixotropic agent, and a polyamide-based thixotropic agent, and specific examples thereof include lauric acid amide, palmitic acid amide, stearic acid amide, behenic acid amide, hydroxystearic acid amide, saturated fatty acid amides, oleic acid amide, erucic acid amide, unsaturated fatty acid amides, p-toluene methane amide, aromatic amide, methylenebisstearic acid amide, ethylenebislauric acid amide, ethylenebishydroxystearic acid amide, saturated fatty acid bisamide, methylenebisoleic acid amide, unsaturated fatty acid bisamide, m-xylylenebisstearic acid amide, aromatic bisamide, saturated fatty acid polyamide, unsaturated fatty acid polyamide, aromatic polyamide, substituted amides, methylol stearic acid amide, methylol amide, and fatty acid ester amides. Examples of sorbitol-based thixotropic agents include dibenzylidene-D-sorbitol and bis(4-methylbenzylidene)-D-sorbitol.

Examples of base agents include nonionic surfactants, weak cationic surfactants, and rosin.

Examples of nonionic surfactants include polyethylene glycol, a polyethylene glycol-polypropylene glycol copolymer, an aliphatic alcohol-polyoxyethylene adduct, an aromatic alcohol-polyoxyethylene adduct, and a polyhydric alcohol-polyoxyethylene adduct.

Examples of weak cationic surfactants include terminal diamine polyethylene glycol, a terminal diamine polyethylene glycol-polypropylene glycol copolymer, an aliphatic amine-polyoxyethylene adduct, an aromatic amine-polyoxyethylene adduct, and a polyvalent amine-polyoxyethylene adduct.

Examples of rosin include raw rosin such as gum rosin, wood rosin, and tall oil rosin, and derivatives obtained from the raw rosin. Examples of the derivatives include purified rosin, hydrogenated rosin, disproportionated rosin, polymerized rosin, an α,β-unsaturated carboxylic acid-modified product (such as acrylated rosin, maleated rosin, or fumarated rosin), a purified product, a hydride, and a disproportionated product of the polymerized rosin, and a purified product, a hydride, and a disproportionated product of α,β-unsaturated carboxylic acid-modified products, and two or more kinds thereof can be used. In addition to a rosin resin, the flux can further contain at least one resin selected from a terpene resin, a modified terpene resin, a terpene phenol resin, a modified terpene phenol resin, a styrene resin, a modified styrene resin, a xylene resin, and a modified xylene resin. An aromatic modified terpene resin, a hydrogenated terpene resin, a hydrogenated aromatic modified terpene resin, or the like can be used as a modified terpene resin. A hydrogenated terpene phenol resin or the like can be used as a modified terpene phenol resin. A styrene-acrylic resin, a styrene-maleic acid resin, or the like can be used as a modified styrene resin. Examples of modified xylene resins include a phenol-modified xylene resin, an alkylphenol-modified xylene resin, a phenol-modified resol-type xylene resin, a polyol-modified xylene resin, and a polyoxyethylene-added xylene resin.

Examples of solvents include water, an alcoholic solvent, a glycol ether-based solvent, and terpineols. Examples of alcoholic solvents include isopropyl alcohol, 1,2-butanediol, isobornyl cyclohexanol, 2,4-diethyl-1,5-pentanediol, 2,2-dimethyl-1,3-propanediol, 2,5-dimethyl-2,5-hexanediol, 2,5-dimethyl-3-hexyne-2,5-diol, 2,3-dimethyl-2,3-butanediol, 1,1,1-tris(hydroxymethyl)ethane, 2-ethyl-2-hydroxymethyl-1,3-propanediol, 2,2'-oxybis(methylene)bis(2-ethyl-1,3-propanediol), 2,2-bis(hydroxymethyl)-1,3-propanediol, 1,2,6-trihydroxyhexane, bis[2,2,2-tris(hydroxymethyl)ethyl]ether, 1-ethynyl-1-cyclohexanol, 1,4-cyclohexanediol, 1,4-cyclohexane dimethanol, erythritol, threitol, guaiacol glycerol ether, 3,6-dimethyl-4-octyne-3,6-diol, and 2,4,7,9-tetramethyl-5-decyne-4,7-diol. Examples of glycol ether-based solvents include diethylene glycol mono-2-ethylhexyl ether, ethylene glycol monophenyl ether, 2-methylpentane-2,4-diol, diethylene glycol monohexyl ether, diethylene glycol dibutyl ether, and triethylene glycol monobutyl ether.

Examples of surfactants include polyoxyalkylene acetylene glycols, polyoxyalkylene glyceryl ether, polyoxyalkylene alkyl ether, polyoxyalkylene ester, polyoxyalkylene alkylamine, and polyoxyalkylene alkylamide.

(2) Amount of Flux

The amount of a flux based on the total mass of a solder paste is preferably 5% to 95% and more preferably 5% to 15%. Within these ranges, the thickening suppression effect due to a solder powder is sufficiently exhibited.

(3) Solder Powder

A solder powder used in the solder paste according to the present invention is preferably a spherical powder. The spherical powder improves the fluidity of solder alloys.

In addition, in the case where the solder alloy is spherical powders which have sizes (grain size distribution) corresponding to Symbols 1 to 8 in the classification (Table 2) of the powder size in JIS Z 3284-1:2014, soldering on fine components can be performed. Particulate solder materials more preferably have sizes corresponding to Symbols 4 to 8 and more preferably have sizes corresponding to Symbols 5 to 8. The sphericity thereof is preferably greater than or equal to 0.90, more preferably greater than or equal to 0.95, and most preferably greater than or equal to 0.99.

In the present invention, the spherical diameter and the sphericity of a solder alloy which is a spherical powder is measured with a CNC image measurement system (Ultra Quick Vision ULTRA QV350-PRO Measurement Device manufactured by Mitutoyo Corporation) in which minimum zone center method (MZC method) is used. In the embodiment, the sphericity represents deviation from a true sphere and is an arithmetic average value calculated when, for example, diameters of 500 balls are divided by major axes. As the value is closer to 1.00 which is the upper limit, the balls are closer to true spheres.

(4) Method for Producing Solder Paste

The solder paste according to the present invention is produced through a method common in the art. First, well-known methods such as a dropping method in which a molten solder material is added dropwise to obtain particles, a spraying method in which the molten solder material is centrifugally sprayed, and a method in which a bulk solder material is pulverized can be employed for the production of a solder powder. In the dropping method or the spraying method, dropping or spraying is preferably performed in an inert atmosphere or a solvent in order to form particles. The above-described components can be heated and mixed with each other to prepare a flux, the above-described solder powder can be introduced into the flux, and the mixture can be stirred and mixed to produce a solder paste.

3. Solder Ball

The solder alloy according to the present invention can be used as a solder ball. In the case where the solder alloy according to the present invention is used as a solder ball, a solder ball can be produced through a dropping method which is a method common in the art. In addition, a solder joint can be produced by processing a solder ball through a method common in the art, for example, through joining of the solder ball by mounting one solder ball on one electrode coated with a flux. The particle diameter of a solder ball is preferably greater than or equal to 1 μm, more preferably greater than or equal to 10 μm, still more preferably greater than or equal to 20 μm, and particularly preferably greater than or equal to 30 μm. The upper limit of the particle diameter of a solder ball is preferably less than or equal to 3,000 μm, more preferably less than or equal to 1,000 μm, still more preferably less than or equal to 600 μm, and particularly preferably less than or equal to 300 μm.

4. Solder Preform

The solder alloy according to the present invention can be used as a preform. Examples of the shape of a preform include washers, rings, pellets, discs, ribbons, and wires.

5. Solder Joint

The solder alloy according to the present invention can form a solder joint by joining an electrode of a package (PKG) of an IC chip or the like to an electrode of a substrate such as a printed circuit board (PCB). This electrode may be a plurality of Cu electrodes having an Ni plating layer which is an electroless Ni plating layer containing P. The solder joint according to the present invention includes an electrode and a solder joint portion. The solder joint portion refers to a portion mainly formed of a solder alloy.

6. Substrate

The substrate according to the present invention has a plate thickness of 5 mm or less and at least one Cu electrode having an Ni plating layer. Each Cu electrode has a solder joint formed from the solder alloy according to the present invention. The Ni plating layer may contain P, and may be an electroless Ni plating layer. In the substrate according to the present invention, a joint is formed using the solder alloy according to the present invention which has a low melting point and excellent ductility. Therefore, even if the plate thickness is less than or equal to 5 mm, occurrence of warpage is suppressed and the connection reliability is excellent. The thickness of a substrate is preferably less than or equal to 3 mm and more preferably less than or equal to 2 mm. Examples of the material of a substrate include Si, glass epoxy, paper phenol, and bakelite. Examples of electrodes included in a substrate include a Cu electrode on which no plating treatment is performed, a Cu electrode on which plating treatment is performed with, for example, Ni, and an Ni electrode.

7. Method for Forming Solder Alloy

A method for producing the solder alloy according to the present invention is not limited and can be produced by melting and mixing raw materials.

A method for forming an As-concentrated layer in a solder alloy is also not limited. Examples of the method for forming an As-concentrated layer include heating of a solder material in an oxidation atmosphere (air or oxygen atmosphere). The heating temperature is not limited, but can be set to, for example, 40° C. to 200° C., and may be 50° C. to 80° C. The heating time is also not limited, and can be set to, for example, several minutes to several days and preferably several minutes to several hours. In order to form a sufficient amount of an As-concentrated layer, the heating time is preferably longer than or equal to 10 minutes and more preferably longer than or equal to 20 minutes. By subjecting the above-described solder powder, solder ball, and solder preform to, for example, this heat treatment, an As-concentrated layer is formed.

A low α-ray material can be used as a raw material of the solder alloy according to the present invention to produce a low α-ray alloy. If such a low α-ray alloy is used to form solder bumps around a memory, soft errors can be suppressed.

EXAMPLES

1. Melting Point of Solder Alloy, 2. As Surface Concentration, 3. Suppression of Thickening Paste, 4. Suppression of Yellowing During Heating Solder Piece, 5. Tensile Strength, 6. Elongation, 6. Film Thickness of P-Rich Layer, 7. Shear Strength, and 8. Plate Exposure Rate were evaluated using solder alloys (mass %) shown in examples and comparative examples in Tables 1 to 8.

1. Melting Point of Solder Alloy

Melting points (° C.) of the solder alloys shown in Tables 1 to 8 were measured with a differential scanning calorimetry (DSC) (manufactured by Seiko Instruments Inc.: DSC6200) under the condition of a heating rate of 5° C./min. In a case where the melting point was less than or equal to 185° C., it was evaluated as "O". In a case where the melting point was greater than 185° C., it was evaluated as "X".

2. As Surface Concentration

The presence or absence of an As-concentrated layer was evaluated as follows using depth direction analysis through X-ray photoelectron spectroscopy (XPS).

(Analysis Conditions)

Analyzer: Micro-region X-ray photoelectron spectroscopic analyzer (AXIS Nova manufactured by Kratos Analytical Limited)

Analysis condition: X-Ray source being AlKα line, X-ray gun voltage being 15 kV, X-ray gun current value being 10 mA, and analysis area being 700 μm×300 μm Sputtering conditions: Ion type being Ar+, accelerating voltage being 2 kV, sputtering rate being 0.5 nm/min (in terms of $SiO_2$)

Samples: Three samples obtained by flatly spreading each solder powder having the alloy composition shown in Tables 1 to 8 without any gap on a stage to which carbon tape was stuck were prepared as samples. However, the sizes of the samples were set to 5.0 mm×5.0 mm. The solder powders were obtained by heating solder powders which have an average particle diameter of 21 μm and correspond to 5 in the classification (Table 2) of the powder size in JIS Z3284-1:2014 for 30 minutes at 60° C. with a dryer in atmospheric air. Solder powders which have not been subjected to heat treatment were used only in Comparative Examples 26 to 39.

(Evaluation Procedure)

An arbitrary area of 700 μm×300 μm was selected from each sample having a size of 5.0 mm×5.0 mm, and XPS analysis was performed on each of Sn, O, and As atoms while performing ion sputtering to obtain an XPS analysis chart. One area was selected for each sample, and each of three samples was analyzed once, for a total of three analyses.

Figure 2:
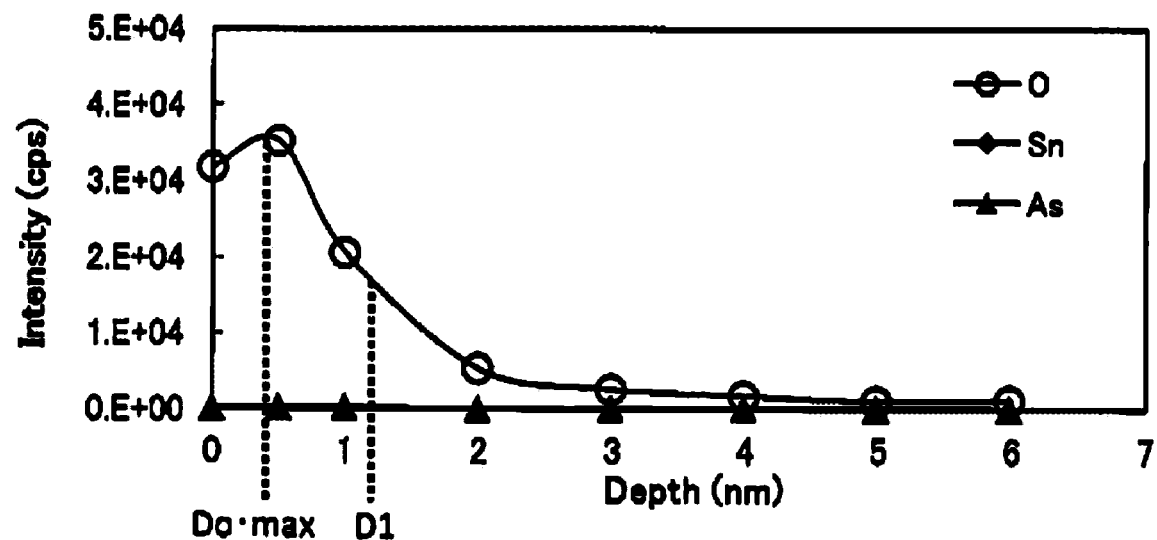
FIG. 2 is a chart of XPS analysis of a surface of a solder ball.
Figure 3:
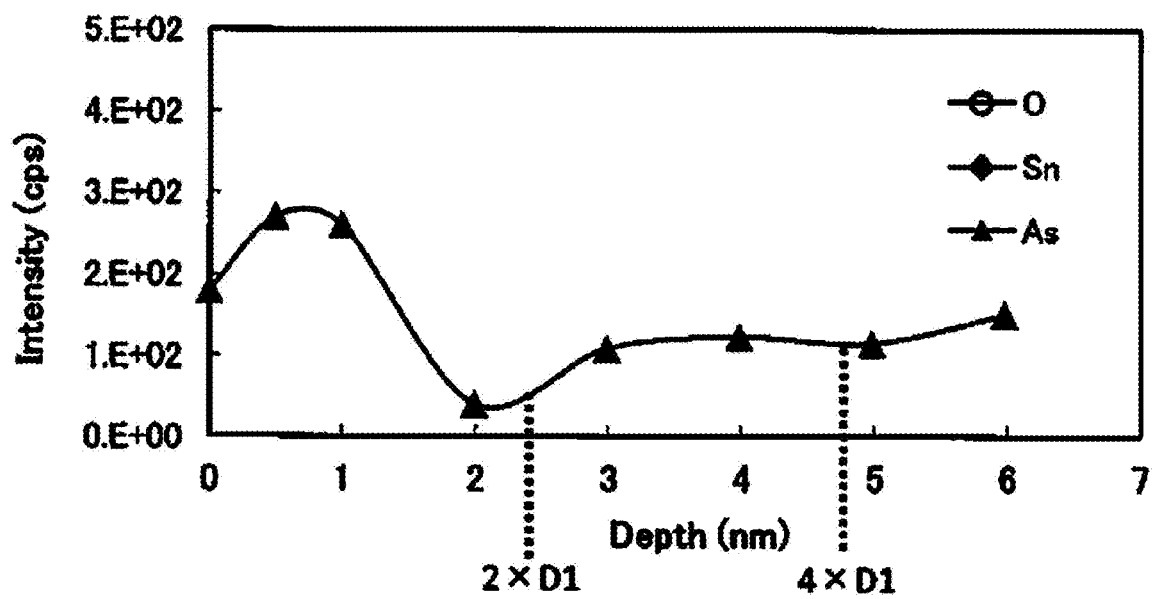
FIG. 3 is a chart of XPS analysis of a surface of a solder ball.

Examples of charts obtained from the XPS analysis are shown in FIGS. 1 to 3. FIGS. 1 to 3 are charts in which the scale of the detection intensity (cps) on the vertical axis is changed for an identical sample, and the horizontal axis is the depth (nm) in terms of $SiO_2$ calculated from the sputtering time. In the XPS analysis charts, the vertical axis is the detection intensity (cps). Although the horizontal axis can be selected from either the sputtering time (min) or the depth (nm) in terms of $SiO_2$ calculated from the sputtering time using a sputter-etching rate of an $SiO_2$ standard sample, the horizontal axis in the XPS analysis charts in FIGS. 1 to 3 is the depth (nm) in terms of $SiO_2$ calculated from the sputtering time using a sputter-etching rate of an $SiO_2$ standard sample.

Moreover, in the XPS analysis chart of each sample, the depth in terms of $SiO_2$ at which the detection intensity of an O atom was maximum was set to Do·max (nm) (refer to FIG. 2). Moreover, the initial depth in terms of $SiO_2$ at which the detection intensity of an O atom was ½ maximum detection intensity (intensity at Do·max) in a portion deeper than Do·max was set to D1 (nm).

Subsequently, in the XPS analysis chart of each sample, an integrated value (S1) of the detection intensity of As in a region (region where the depth in terms of $SiO_2$ was 0 to 2×D1 (nm)) from the outermost surface to the depth 2×D1 and an integrated value (S2) of the detection intensity of As in a region (region where the depth in terms of $SiO_2$ was 2×D1 to 4×D1 (nm)) from the depth 2×D1 to a portion deeper by 2×D1 were obtained (refer to FIG. 3) and were compared from each other.

Then, an evaluation was performed based on the following criteria.

S1>S2 at all three times of measurement: As-Concentrated layer is formed: (O)

S1>S2 at two or less times out of all three times of measurement: No As-concentrated layer is formed: (X)

3. Suppression of Thickening Paste

A solder powder obtained in "2. As Surface Concentration" and a flux shown in Table 9 were heated and stirred so that the mass ratio (flux:solder powder) of the flux to the solder powder becomes 11:89, and were then cooled to produce a solder paste. The viscosity of these solder pastes was continuously measured for 12 hours at a rotation frequency of 10 rpm and a measurement temperature of 25° C. using a rotational viscometer (PCU-205 manufactured by Malcolm Co., Ltd.) according to the method described in "4.2 Test for Viscosity Characteristics" of JIS Z 3284-3: 2014. An initial viscosity (viscosity after 30 minutes of stirring) was compared with a viscosity after 12 hours to evaluate the thickening suppression effect based on the following criteria.

Viscosity after 12 hours≤initial viscosity×1.2: Favorable due to small increase in viscosity over time: (O)

Viscosity after 12 hours>initial viscosity×1.2: Failure due to large increase in viscosity over time: (X)

4. Suppression of Yellowing During Heating Solder Piece

The solder balls (with a spherical diameter of 0.3 mm) having the alloy compositions shown in Tables 1 to 8 were heated for 30 minutes at 60° C. using a dryer in atmospheric air and then heated for 2 hours in a constant-temperature tank at 200° C. in an air atmosphere. The yellowness b* of the solder balls in the L*a*b* color system before and after heating was measured, and the amount of increase (Δb*) obtained by subtracting b* before heating from b* after heating was calculated. Solder balls which have not been subjected to heat treatment were used only in Comparative Examples 26 to 39 and introduced into a constant-temperature tank.

The yellowness b* was obtained from color values (L*, a*, b*) by measuring spectral transmittance according to "Methods of Color Measurement-Color of Reflecting and Transmitting Objects" of JIS Z 8722:2009 with a light source D65 and a 10-degree field of view using a CM-3500d2600d-type spectrocolorimeter (manufactured by Konica Minolta, Inc.) The color values (L*, a*, b*) are based on the standard of JIS Z 8781-4:2013.

The value Δb* is less than or equal to 70% of Δb* (reference): O (Good)

The value Δb* is greater than 70% of Δb* (reference): X (Poor)

5. Tensile Strength, 6. Elongation

The solder alloys shown in Tables 1 to 8 were formed to have a predetermined shape, and the tensile strength (MPa) and the elongation (%) were measured using a tensile strength tester (manufactured by Shimadzu Corporation, AUTO GRAPH AG-20kN) at a stroke speed of 6.0 mm/min and a distortion speed of 0.33%/sec. If the tensile strength is greater than or equal to 70 MPa and the elongation is greater than or equal to 65%, the solder alloys can be used without any practical problem.

In a case where the tensile strength is greater than or equal to 70 MPa, it was evaluated as "O", and in a case where the tensile strength is less than 70 MPa, it was evaluated as "X". In addition, in a case where the elongation was greater than or equal to 65%, it was evaluated as "O", and in a case where the elongation was less than 65%, it was evaluated as "X".

7. Film Thickness of P-Rich Layer

Each of the solder alloys shown in Tables 1 to 8 was joined to a Cu electrode (hereinafter, simply referred to as an "electroless Ni/Au electrode"), on which electroless Ni/Au plating treatment was performed and which had a diameter of 0.24 mm, of PCB which was a substrate having a thickness of 1.2 mm to perform soldering. An water-soluble flux (manufactured by Senju Metal Industry Co., Ltd.: WF-6400) was applied to a substrate, and then, a solder ball which had a diameter of 0.3 mm and was produced from each solder alloy was mounted thereon to perform soldering through a reflow method with a reflow profile having a peak temperature of 210° C., and a sample in which a solder joint was formed was obtained.

The film thickness of a P-rich layer of each sample was determined by observing the cross section near a joining interface between the solder joint portion and an Ni plating layer based on an SEM photograph. Specifically, the photograph was analyzed with an electron microscope (manufactured by JEOL Ltd.: JSM-7000F), a P-rich layer and a layer which was not a P-rich layer were distinguished by colors, and the film thickness (μm) of the P-rich layer was measured. The film thickness of P-rich layers of five samples produced under the same conditions was measured in the same manner, and an average value thereof was regarded as a film thickness of a P-rich layer.

In a case where the film thickness of a P-rich layer was less than or equal to 0.014 μm, it was evaluated as "O", and in a case where the film thickness thereof is greater than 0.014 μm, it was evaluated as "X".

8. Shear Strength

Two types of electrodes, a Cu electrode (hereinafter, simply referred to as a "Cu electrode") on which plating treatment was not performed and an electroless Ni/Au electrode, of PCB which had the same size as that of the electrode used in "7. Film Thickness of P-Rich Layer" were joined to each of the solder alloys shown in Tables 1 to 8 to perform soldering. The shear strength (N) of each sample was measured with a shear strength measurement device (manufactured by Dage: SERIES 4000HS) under the condition of 1,000 mm/sec. If the shear strength in the Cu electrode is greater than or equal to 3.00 N and the shear strength in the electroless Ni/Au electrode is greater than or equal to 2.60 N, the solder alloys can be used without any practical problem.

In a case where the shear strength in the Cu electrode was greater than or equal to 3.00 N, it was evaluated as "O", and in a case where the shear strength therein was less than 3.00 N, it was evaluated as "X". In addition, in a case where the shear strength in the electroless Ni/Au electrode was greater than or equal to 2.60 N, it was evaluated as "O", and in a case where the shear strength therein was less than 2.60 N, it was evaluated as "X".

9. Plate Exposure Rate

Regarding the samples after the shear strength test, a surface SEM photograph of the electroless Ni/Au electrode after each solder joint was sheared was imaged. Then, a region where Ni was exposed was specified by performing EDS analysis, and the area of the region was obtained through image analysis software (Scandium) manufactured by SEIKA CORPORATION. Finally, the area of the region where the Ni plating layer was exposed was divided by the area of the entire electrode to calculate a plate exposure rate (%).

In a case where the plate exposure rate was 0%, it was evaluated as "O", and in a case where the plate exposure rate was greater than 0%, it was evaluated as "X".

10. Comprehensive Evaluation

In a case where all of the above-described tests scored "O", it was evaluated as "O". In a case where any one of the tests scored "X", it was evaluated as "X".

The evaluation results are shown in Tables 1 to 8.

TABLE 1

| | Composition (mass %) | | | | | | Melting point (° C.) | As surface concentration | Suppression of thickening paste | Suppression of yellowing during heating solder piece |
|---|---|---|---|---|---|---|---|---|---|---|
| | Sn | Bi | Cu | Ni | As | P | Ge | | | | |
| Example 1 | Bal. | 35 | 0.3 | 0.03 | 0.004 | — | — | O | O | O | O |
| Example 2 | Bal. | 35 | 0.5 | 0.03 | 0.004 | — | — | O | O | O | O |
| Example 3 | Bal. | 35 | 0.7 | 0.03 | 0.004 | — | — | O | O | O | O |
| Example 4 | Bal. | 35 | 0.5 | 0.01 | 0.004 | — | — | O | O | O | O |
| Example 5 | Bal. | 35 | 0.5 | 0.06 | 0.004 | — | — | O | O | O | O |
| Example 6 | Bal. | 40 | 0.3 | 0.03 | 0.004 | — | — | O | O | O | O |
| Example 7 | Bal. | 40 | 0.5 | 0.03 | 0.004 | — | — | O | O | O | O |
| Example 8 | Bal. | 40 | 0.7 | 0.03 | 0.004 | — | — | O | O | O | O |
| Example 9 | Bal. | 40 | 0.9 | 0.03 | 0.004 | — | — | O | O | O | O |
| Example 10 | Bal. | 40 | 0.5 | 0.01 | 0.004 | — | — | O | O | O | O |
| Example 11 | Bal. | 40 | 0.5 | 0.06 | 0.004 | — | — | O | O | O | O |
| Example 12 | Bal. | 45 | 0.3 | 0.03 | 0.004 | — | — | O | O | O | O |
| Example 13 | Bal. | 45 | 0.5 | 0.03 | 0.004 | — | — | O | O | O | O |
| Example 14 | Bal. | 45 | 0.7 | 0.03 | 0.004 | — | — | O | O | O | O |
| Example 15 | Bal. | 45 | 0.5 | 0.01 | 0.004 | — | — | O | O | O | O |
| Example 16 | Bal. | 45 | 0.5 | 0.06 | 0.004 | — | — | O | O | O | O |
| Example 17 | Bal. | 58 | 0.3 | 0.03 | 0.004 | — | — | O | O | O | O |
| Example 18 | Bal. | 58 | 0.5 | 0.03 | 0.004 | — | — | O | O | O | O |
| Example 19 | Bal. | 58 | 0.7 | 0.03 | 0.004 | — | — | O | O | O | O |
| Example 20 | Bal. | 58 | 0.5 | 0.01 | 0.004 | — | — | O | O | O | O |
| Example 21 | Bal. | 58 | 0.5 | 0.06 | 0.004 | — | — | O | O | O | O |
| Example 22 | Bal. | 35 | 0.5 | 0.01 | 0.004 | 0.003 | — | O | O | O | O |

| | Tensile strength | Elongation | Film thickness of P high-concentration layer | Shear strength (N) Cu plate | Shear strength (N) Electroless Ni/Au plate | Plate exposure rate Ni/Au plate | Comprehensive evaluation |
|---|---|---|---|---|---|---|---|
| Example 1 | O | O | O | O | O | O | O |
| Example 2 | O | O | O | O | O | O | O |
| Example 3 | O | O | O | O | O | O | O |
| Example 4 | O | O | O | O | O | O | O |
| Example 5 | O | O | O | O | O | O | O |
| Example 6 | O | O | O | O | O | O | O |
| Example 7 | O | O | O | O | O | O | O |
| Example 8 | O | O | O | O | O | O | O |
| Example 9 | O | O | O | O | O | O | O |
| Example 10 | O | O | O | O | O | O | O |
| Example 11 | O | O | O | O | O | O | O |
| Example 12 | O | O | O | O | O | O | O |
| Example 13 | O | O | O | O | O | O | O |
| Example 14 | O | O | O | O | O | O | O |
| Example 15 | O | O | O | O | O | O | O |
| Example 16 | O | O | O | O | O | O | O |
| Example 17 | O | O | O | O | O | O | O |

TABLE 1-continued

| | | | | | | | |
|---|---|---|---|---|---|---|---|
| Example 18 | ○ | ○ | ○ | ○ | ○ | ○ | ○ |
| Example 19 | ○ | ○ | ○ | ○ | ○ | ○ | ○ |
| Example 20 | ○ | ○ | ○ | ○ | ○ | ○ | ○ |
| Example 21 | ○ | ○ | ○ | ○ | ○ | ○ | ○ |
| Example 22 | ○ | ○ | ○ | ○ | ○ | ○ | ○ |

TABLE 2

| | Composition (mass %) | | | | | | | Melting point (° C.) | As surface concentration | Suppression of thickening paste | Suppression of yellowing during heating solder piece |
|---|---|---|---|---|---|---|---|---|---|---|---|
| | Sn | Bi | Cu | Ni | As | P | Ge | | | | |
| Example 23 | Bal. | 35 | 0.5 | 0.06 | 0.004 | 0.05 | — | ○ | ○ | ○ | ○ |
| Example 24 | Bal. | 40 | 0.5 | 0.01 | 0.004 | 0.003 | — | ○ | ○ | ○ | ○ |
| Example 25 | Bal. | 40 | 0.5 | 0.06 | 0.004 | 0.05 | — | ○ | ○ | ○ | ○ |
| Example 26 | Bal. | 45 | 0.5 | 0.01 | 0.004 | 0.003 | — | ○ | ○ | ○ | ○ |
| Example 27 | Bal. | 45 | 0.5 | 0.06 | 0.004 | 0.05 | — | ○ | ○ | ○ | ○ |
| Example 28 | Bal. | 58 | 0.5 | 0.01 | 0.004 | 0.003 | — | ○ | ○ | ○ | ○ |
| Example 29 | Bal. | 58 | 0.5 | 0.06 | 0.004 | 0.05 | — | ○ | ○ | ○ | ○ |
| Example 30 | Bal. | 45 | 0.5 | 0.06 | 0.004 | — | 0.003 | ○ | ○ | ○ | ○ |
| Example 31 | Bal. | 58 | 0.5 | 0.01 | 0.004 | — | 0.05 | ○ | ○ | ○ | ○ |
| Example 32 | Bal. | 58 | 0.5 | 0.06 | 0.004 | 0.0015 | 0.0015 | ○ | ○ | ○ | ○ |
| Example 33 | Bal. | 58 | 0.5 | 0.06 | 0.004 | 0.025 | 0.025 | ○ | ○ | ○ | ○ |
| Example 34 | Bal. | 35 | 0.3 | 0.03 | 0.008 | — | — | ○ | ○ | ○ | ○ |
| Example 35 | Bal. | 35 | 0.5 | 0.03 | 0.008 | — | — | ○ | ○ | ○ | ○ |
| Example 36 | Bal. | 35 | 0.7 | 0.03 | 0.008 | — | — | ○ | ○ | ○ | ○ |
| Example 37 | Bal. | 35 | 0.5 | 0.01 | 0.008 | — | — | ○ | ○ | ○ | ○ |
| Example 38 | Bal. | 35 | 0.5 | 0.06 | 0.008 | — | — | ○ | ○ | ○ | ○ |
| Example 39 | Bal. | 40 | 0.3 | 0.03 | 0.008 | — | — | ○ | ○ | ○ | ○ |
| Example 40 | Bal. | 40 | 0.5 | 0.03 | 0.008 | — | — | ○ | ○ | ○ | ○ |
| Example 41 | Bal. | 40 | 0.7 | 0.03 | 0.008 | — | — | ○ | ○ | ○ | ○ |
| Example 42 | Bal. | 40 | 0.9 | 0.03 | 0.008 | — | — | ○ | ○ | ○ | ○ |
| Example 43 | Bal. | 40 | 0.5 | 0.01 | 0.008 | — | — | ○ | ○ | ○ | ○ |
| Example 44 | Bal. | 40 | 0.5 | 0.06 | 0.008 | — | — | ○ | ○ | ○ | ○ |

| | Tensile strength | Elongation | Film thickness of P high-concentration layer | Shear strength (N) Cu plate | Shear strength (N) Electroless Ni/Au plate | Plate exposure rate Ni/Au plate | Comprehensive evaluation |
|---|---|---|---|---|---|---|---|
| Example 23 | ○ | ○ | ○ | ○ | ○ | ○ | ○ |
| Example 24 | ○ | ○ | ○ | ○ | ○ | ○ | ○ |
| Example 25 | ○ | ○ | ○ | ○ | ○ | ○ | ○ |
| Example 26 | ○ | ○ | ○ | ○ | ○ | ○ | ○ |
| Example 27 | ○ | ○ | ○ | ○ | ○ | ○ | ○ |
| Example 28 | ○ | ○ | ○ | ○ | ○ | ○ | ○ |
| Example 29 | ○ | ○ | ○ | ○ | ○ | ○ | ○ |
| Example 30 | ○ | ○ | ○ | ○ | ○ | ○ | ○ |
| Example 31 | ○ | ○ | ○ | ○ | ○ | ○ | ○ |
| Example 32 | ○ | ○ | ○ | ○ | ○ | ○ | ○ |
| Example 33 | ○ | ○ | ○ | ○ | ○ | ○ | ○ |
| Example 34 | ○ | ○ | ○ | ○ | ○ | ○ | ○ |
| Example 35 | ○ | ○ | ○ | ○ | ○ | ○ | ○ |
| Example 36 | ○ | ○ | ○ | ○ | ○ | ○ | ○ |
| Example 37 | ○ | ○ | ○ | ○ | ○ | ○ | ○ |
| Example 38 | ○ | ○ | ○ | ○ | ○ | ○ | ○ |
| Example 39 | ○ | ○ | ○ | ○ | ○ | ○ | ○ |
| Example 40 | ○ | ○ | ○ | ○ | ○ | ○ | ○ |
| Example 41 | ○ | ○ | ○ | ○ | ○ | ○ | ○ |
| Example 42 | ○ | ○ | ○ | ○ | ○ | ○ | ○ |
| Example 43 | ○ | ○ | ○ | ○ | ○ | ○ | ○ |
| Example 44 | ○ | ○ | ○ | ○ | ○ | ○ | ○ |

TABLE 3

| | Composition (mass %) | | | | | | Melting point (° C.) | As surface concentration | Suppression of thickening paste | Suppression of yellowing during heating solder piece |
| --- | --- | --- | --- | --- | --- | --- | --- | --- | --- | --- |
| | Sn | Bi | Cu | Ni | As | P | Ge | | | | |
| Example 45 | Bal. | 45 | 0.3 | 0.03 | 0.008 | — | — | ○ | ○ | ○ | ○ |
| Example 46 | Bal. | 45 | 0.5 | 0.03 | 0.008 | — | — | ○ | ○ | ○ | ○ |
| Example 47 | Bal. | 45 | 0.7 | 0.03 | 0.008 | — | — | ○ | ○ | ○ | ○ |
| Example 48 | Bal. | 45 | 0.5 | 0.01 | 0.008 | — | — | ○ | ○ | ○ | ○ |
| Example 49 | Bal. | 45 | 0.5 | 0.06 | 0.008 | — | — | ○ | ○ | ○ | ○ |
| Example 50 | Bal. | 58 | 0.3 | 0.03 | 0.008 | — | — | ○ | ○ | ○ | ○ |
| Example 51 | Bal. | 58 | 0.5 | 0.03 | 0.008 | — | — | ○ | ○ | ○ | ○ |
| Example 52 | Bal. | 58 | 0.7 | 0.03 | 0.008 | — | — | ○ | ○ | ○ | ○ |
| Example 53 | Bal. | 58 | 0.5 | 0.01 | 0.008 | — | — | ○ | ○ | ○ | ○ |
| Example 54 | Bal. | 58 | 0.5 | 0.06 | 0.008 | — | — | ○ | ○ | ○ | ○ |
| Example 55 | Bal. | 35 | 0.5 | 0.01 | 0.008 | 0.003 | — | ○ | ○ | ○ | ○ |
| Example 56 | Bal. | 35 | 0.5 | 0.06 | 0.008 | 0.05 | — | ○ | ○ | ○ | ○ |
| Example 57 | Bal. | 45 | 0.5 | 0.06 | 0.008 | 0.05 | — | ○ | ○ | ○ | ○ |
| Example 58 | Bal. | 58 | 0.5 | 0.01 | 0.008 | 0.003 | — | ○ | ○ | ○ | ○ |
| Example 59 | Bal. | 58 | 0.5 | 0.06 | 0.008 | 0.05 | — | ○ | ○ | ○ | ○ |
| Example 60 | Bal. | 45 | 0.5 | 0.06 | 0.008 | — | 0.003 | ○ | ○ | ○ | ○ |
| Example 61 | Bal. | 58 | 0.5 | 0.01 | 0.008 | — | 0.05 | ○ | ○ | ○ | ○ |
| Example 62 | Bal. | 58 | 0.5 | 0.06 | 0.008 | 0.0015 | 0.0015 | ○ | ○ | ○ | ○ |
| Example 63 | Bal. | 58 | 0.5 | 0.06 | 0.008 | 0.025 | 0.025 | ○ | ○ | ○ | ○ |
| Example 64 | Bal. | 35 | 0.3 | 0.03 | 0.015 | — | — | ○ | ○ | ○ | ○ |
| Example 65 | Bal. | 35 | 0.5 | 0.03 | 0.015 | — | — | ○ | ○ | ○ | ○ |
| Example 66 | Bal. | 35 | 0.7 | 0.03 | 0.015 | — | — | ○ | ○ | ○ | ○ |

| | Tensile strength | Elongation | Film thickness of P high-concentration layer | Shear strength (N) | | Plate exposure rate | Comprehensive evaluation |
| --- | --- | --- | --- | --- | --- | --- | --- |
| | | | | Cu plate | Electroless Ni/Au plate | Ni/Au plate | |
| Example 45 | ○ | ○ | ○ | ○ | ○ | ○ | ○ |
| Example 46 | ○ | ○ | ○ | ○ | ○ | ○ | ○ |
| Example 47 | ○ | ○ | ○ | ○ | ○ | ○ | ○ |
| Example 48 | ○ | ○ | ○ | ○ | ○ | ○ | ○ |
| Example 49 | ○ | ○ | ○ | ○ | ○ | ○ | ○ |
| Example 50 | ○ | ○ | ○ | ○ | ○ | ○ | ○ |
| Example 51 | ○ | ○ | ○ | ○ | ○ | ○ | ○ |
| Example 52 | ○ | ○ | ○ | ○ | ○ | ○ | ○ |
| Example 53 | ○ | ○ | ○ | ○ | ○ | ○ | ○ |
| Example 54 | ○ | ○ | ○ | ○ | ○ | ○ | ○ |
| Example 55 | ○ | ○ | ○ | ○ | ○ | ○ | ○ |
| Example 56 | ○ | ○ | ○ | ○ | ○ | ○ | ○ |
| Example 57 | ○ | ○ | ○ | ○ | ○ | ○ | ○ |
| Example 58 | ○ | ○ | ○ | ○ | ○ | ○ | ○ |
| Example 59 | ○ | ○ | ○ | ○ | ○ | ○ | ○ |
| Example 60 | ○ | ○ | ○ | ○ | ○ | ○ | ○ |
| Example 61 | ○ | ○ | ○ | ○ | ○ | ○ | ○ |
| Example 62 | ○ | ○ | ○ | ○ | ○ | ○ | ○ |
| Example 63 | ○ | ○ | ○ | ○ | ○ | ○ | ○ |
| Example 64 | ○ | ○ | ○ | ○ | ○ | ○ | ○ |
| Example 65 | ○ | ○ | ○ | ○ | ○ | ○ | ○ |
| Example 66 | ○ | ○ | ○ | ○ | ○ | ○ | ○ |

TABLE 4

| | Composition (mass %) | | | | | | | Melting point (° C.) | As surface concentration | Suppression of thickening paste | Suppression of yellowing during heating solder piece |
| --- | --- | --- | --- | --- | --- | --- | --- | --- | --- | --- | --- |
| | Sn | Bi | Cu | Ni | As | P | Ge | | | | |
| Example 67 | Bal. | 35 | 0.5 | 0.01 | 0.015 | — | — | ○ | ○ | ○ | ○ |
| Example 68 | Bal. | 35 | 0.5 | 0.06 | 0.015 | — | — | ○ | ○ | ○ | ○ |
| Example 69 | Bal. | 40 | 0.3 | 0.03 | 0.015 | — | — | ○ | ○ | ○ | ○ |
| Example 70 | Bal. | 40 | 0.5 | 0.03 | 0.015 | — | — | ○ | ○ | ○ | ○ |
| Example 71 | Bal. | 40 | 0.7 | 0.03 | 0.015 | — | — | ○ | ○ | ○ | ○ |
| Example 72 | Bal. | 40 | 0.9 | 0.03 | 0.015 | — | — | ○ | ○ | ○ | ○ |

TABLE 4-continued

| | Sn | Bi | Cu | Ni | As | P | Ge | Melting point | As surface concentration | Suppression of thickening paste | Suppression of yellowing during heating solder piece |
|---|---|---|---|---|---|---|---|---|---|---|---|
| Example 73 | Bal. | 40 | 0.5 | 0.01 | 0.015 | — | — | ○ | ○ | ○ | ○ |
| Example 74 | Bal. | 40 | 0.5 | 0.06 | 0.015 | — | — | ○ | ○ | ○ | ○ |
| Example 75 | Bal. | 45 | 0.3 | 0.03 | 0.015 | — | — | ○ | ○ | ○ | ○ |
| Example 76 | Bal. | 45 | 0.5 | 0.03 | 0.015 | — | — | ○ | ○ | ○ | ○ |
| Example 77 | Bal. | 45 | 0.7 | 0.03 | 0.015 | — | — | ○ | ○ | ○ | ○ |
| Example 78 | Bal. | 45 | 0.5 | 0.01 | 0.015 | — | — | ○ | ○ | ○ | ○ |
| Example 79 | Bal. | 45 | 0.5 | 0.06 | 0.015 | — | — | ○ | ○ | ○ | ○ |
| Example 80 | Bal. | 58 | 0.3 | 0.03 | 0.015 | — | — | ○ | ○ | ○ | ○ |
| Example 81 | Bal. | 58 | 0.5 | 0.03 | 0.015 | — | — | ○ | ○ | ○ | ○ |
| Example 82 | Bal. | 58 | 0.7 | 0.03 | 0.015 | — | — | ○ | ○ | ○ | ○ |
| Example 83 | Bal. | 58 | 0.5 | 0.01 | 0.015 | — | — | ○ | ○ | ○ | ○ |
| Example 84 | Bal. | 58 | 0.5 | 0.06 | 0.015 | — | — | ○ | ○ | ○ | ○ |
| Example 85 | Bal. | 58 | 0.5 | 0.01 | 0.015 | 0.003 | — | ○ | ○ | ○ | ○ |
| Example 86 | Bal. | 58 | 0.5 | 0.06 | 0.015 | 0.05 | — | ○ | ○ | ○ | ○ |
| Example 87 | Bal. | 45 | 0.5 | 0.06 | 0.015 | — | 0.003 | ○ | ○ | ○ | ○ |
| Example 88 | Bal. | 58 | 0.5 | 0.01 | 0.015 | — | 0.05 | ○ | ○ | ○ | ○ |

| | Tensile strength | Elongation | Film thickness of P high-concentration layer | Shear strength (N) Cu plate | Shear strength (N) Electroless Ni/Au plate | Plate exposure rate Ni/Au plate | Comprehensive evaluation |
|---|---|---|---|---|---|---|---|
| Example 67 | ○ | ○ | ○ | ○ | ○ | ○ | ○ |
| Example 68 | ○ | ○ | ○ | ○ | ○ | ○ | ○ |
| Example 69 | ○ | ○ | ○ | ○ | ○ | ○ | ○ |
| Example 70 | ○ | ○ | ○ | ○ | ○ | ○ | ○ |
| Example 71 | ○ | ○ | ○ | ○ | ○ | ○ | ○ |
| Example 72 | ○ | ○ | ○ | ○ | ○ | ○ | ○ |
| Example 73 | ○ | ○ | ○ | ○ | ○ | ○ | ○ |
| Example 74 | ○ | ○ | ○ | ○ | ○ | ○ | ○ |
| Example 75 | ○ | ○ | ○ | ○ | ○ | ○ | ○ |
| Example 76 | ○ | ○ | ○ | ○ | ○ | ○ | ○ |
| Example 77 | ○ | ○ | ○ | ○ | ○ | ○ | ○ |
| Example 78 | ○ | ○ | ○ | ○ | ○ | ○ | ○ |
| Example 79 | ○ | ○ | ○ | ○ | ○ | ○ | ○ |
| Example 80 | ○ | ○ | ○ | ○ | ○ | ○ | ○ |
| Example 81 | ○ | ○ | ○ | ○ | ○ | ○ | ○ |
| Example 82 | ○ | ○ | ○ | ○ | ○ | ○ | ○ |
| Example 83 | ○ | ○ | ○ | ○ | ○ | ○ | ○ |
| Example 84 | ○ | ○ | ○ | ○ | ○ | ○ | ○ |
| Example 85 | ○ | ○ | ○ | ○ | ○ | ○ | ○ |
| Example 86 | ○ | ○ | ○ | ○ | ○ | ○ | ○ |
| Example 87 | ○ | ○ | ○ | ○ | ○ | ○ | ○ |
| Example 88 | ○ | ○ | ○ | ○ | ○ | ○ | ○ |

TABLE 5

| | Composition (mass %) | | | | | | | Melting point (° C.) | As surface concentration | Suppression of thickening paste | Suppression of yellowing during heating solder piece |
|---|---|---|---|---|---|---|---|---|---|---|---|
| | Sn | Bi | Cu | Ni | As | P | Ge | | | | |
| Example 89 | Bal. | 58 | 0.5 | 0.06 | 0.015 | 0.0015 | 0.0015 | ○ | ○ | ○ | ○ |
| Example 90 | Bal. | 58 | 0.5 | 0.06 | 0.015 | 0.025 | 0.025 | ○ | ○ | ○ | ○ |
| Example 91 | Bal. | 35 | 0.3 | 0.03 | 0.025 | — | — | ○ | ○ | ○ | ○ |
| Example 92 | Bal. | 35 | 0.5 | 0.03 | 0.025 | — | — | ○ | ○ | ○ | ○ |
| Example 93 | Bal. | 35 | 0.7 | 0.03 | 0.025 | — | — | ○ | ○ | ○ | ○ |
| Example 94 | Bal. | 35 | 0.5 | 0.01 | 0.025 | — | — | ○ | ○ | ○ | ○ |
| Example 95 | Bal. | 35 | 0.5 | 0.06 | 0.025 | — | — | ○ | ○ | ○ | ○ |
| Example 96 | Bal. | 40 | 0.3 | 0.03 | 0.025 | — | — | ○ | ○ | ○ | ○ |
| Example 97 | Bal. | 40 | 0.5 | 0.03 | 0.025 | — | — | ○ | ○ | ○ | ○ |
| Example 98 | Bal. | 40 | 0.7 | 0.03 | 0.025 | — | — | ○ | ○ | ○ | ○ |
| Example 99 | Bal. | 40 | 0.9 | 0.03 | 0.025 | — | — | ○ | ○ | ○ | ○ |
| Example 100 | Bal. | 40 | 0.5 | 0.01 | 0.025 | — | — | ○ | ○ | ○ | ○ |
| Example 101 | Bal. | 40 | 0.5 | 0.06 | 0.025 | — | — | ○ | ○ | ○ | ○ |
| Example 102 | Bal. | 45 | 0.3 | 0.03 | 0.025 | — | — | ○ | ○ | ○ | ○ |
| Example 103 | Bal. | 45 | 0.5 | 0.03 | 0.025 | — | — | ○ | ○ | ○ | ○ |
| Example 104 | Bal. | 45 | 0.7 | 0.03 | 0.025 | — | — | ○ | ○ | ○ | ○ |
| Example 105 | Bal. | 45 | 0.5 | 0.01 | 0.025 | — | — | ○ | ○ | ○ | ○ |
| Example 106 | Bal. | 45 | 0.5 | 0.06 | 0.025 | — | — | ○ | ○ | ○ | ○ |
| Example 107 | Bal. | 58 | 0.3 | 0.03 | 0.025 | — | — | ○ | ○ | ○ | ○ |
| Example 108 | Bal. | 58 | 0.5 | 0.03 | 0.025 | — | — | ○ | ○ | ○ | ○ |

TABLE 5-continued

| | | Sn | Bi | Cu | Ni | As | P | Ge | | | | |
|---|---|---|---|---|---|---|---|---|---|---|---|---|
| Example 109 | | Bal. | 58 | 0.7 | 0.03 | 0.025 | — | — | ○ | ○ | ○ | ○ |
| Example 110 | | Bal. | 58 | 0.5 | 0.01 | 0.025 | — | — | ○ | ○ | ○ | ○ |

| | Tensile strength | Elongation | Film thickness of P high-concentration layer | Shear strength (N) Cu plate | Shear strength (N) Electroless Ni/Au plate | Plate exposure rate Ni/Au plate | Comprehensive evaluation |
|---|---|---|---|---|---|---|---|
| Example 89 | ○ | ○ | ○ | ○ | ○ | ○ | ○ |
| Example 90 | ○ | ○ | ○ | ○ | ○ | ○ | ○ |
| Example 91 | ○ | ○ | ○ | ○ | ○ | ○ | ○ |
| Example 92 | ○ | ○ | ○ | ○ | ○ | ○ | ○ |
| Example 93 | ○ | ○ | ○ | ○ | ○ | ○ | ○ |
| Example 94 | ○ | ○ | ○ | ○ | ○ | ○ | ○ |
| Example 95 | ○ | ○ | ○ | ○ | ○ | ○ | ○ |
| Example 96 | ○ | ○ | ○ | ○ | ○ | ○ | ○ |
| Example 97 | ○ | ○ | ○ | ○ | ○ | ○ | ○ |
| Example 98 | ○ | ○ | ○ | ○ | ○ | ○ | ○ |
| Example 99 | ○ | ○ | ○ | ○ | ○ | ○ | ○ |
| Example 100 | ○ | ○ | ○ | ○ | ○ | ○ | ○ |
| Example 101 | ○ | ○ | ○ | ○ | ○ | ○ | ○ |
| Example 102 | ○ | ○ | ○ | ○ | ○ | ○ | ○ |
| Example 103 | ○ | ○ | ○ | ○ | ○ | ○ | ○ |
| Example 104 | ○ | ○ | ○ | ○ | ○ | ○ | ○ |
| Example 105 | ○ | ○ | ○ | ○ | ○ | ○ | ○ |
| Example 106 | ○ | ○ | ○ | ○ | ○ | ○ | ○ |
| Example 107 | ○ | ○ | ○ | ○ | ○ | ○ | ○ |
| Example 108 | ○ | ○ | ○ | ○ | ○ | ○ | ○ |
| Example 109 | ○ | ○ | ○ | ○ | ○ | ○ | ○ |
| Example 110 | ○ | ○ | ○ | ○ | ○ | ○ | ○ |

TABLE 6

| | Composition (mass %) | | | | | | | Melting point (° C.) | As surface concentration | Suppression of thickening paste | Suppression of yellowing during heating solder piece |
|---|---|---|---|---|---|---|---|---|---|---|---|
| | Sn | Bi | Cu | Ni | As | P | Ge | | | | |
| Example 111 | Bal. | 58 | 0.5 | 0.06 | 0.025 | — | — | ○ | ○ | ○ | ○ |
| Example 112 | Bal. | 40 | 0.5 | 0.06 | 0.025 | 0.05 | — | ○ | ○ | ○ | ○ |
| Example 113 | Bal. | 45 | 0.5 | 0.01 | 0.025 | 0.003 | — | ○ | ○ | ○ | ○ |
| Example 114 | Bal. | 45 | 0.5 | 0.06 | 0.025 | 0.05 | — | ○ | ○ | ○ | ○ |
| Example 115 | Bal. | 58 | 0.5 | 0.01 | 0.025 | 0.003 | — | ○ | ○ | ○ | ○ |
| Example 116 | Bal. | 58 | 0.5 | 0.06 | 0.025 | 0.05 | — | ○ | ○ | ○ | ○ |
| Example 117 | Bal. | 45 | 0.5 | 0.06 | 0.025 | — | 0.003 | ○ | ○ | ○ | ○ |
| Example 118 | Bal. | 58 | 0.5 | 0.01 | 0.025 | — | 0.05 | ○ | ○ | ○ | ○ |
| Example 119 | Bal. | 58 | 0.5 | 0.06 | 0.025 | 0.0015 | 0.0015 | ○ | ○ | ○ | ○ |
| Example 120 | Bal. | 58 | 0.5 | 0.06 | 0.025 | 0.025 | 0.025 | ○ | ○ | ○ | ○ |
| Comparative Example 1 | Bal. | 58 | — | — | — | — | — | ○ | X | X | X |
| Comparative Example 2 | Bal. | 40 | 0.5 | — | — | — | — | ○ | X | X | X |
| Comparative Example 3 | Bal. | 40 | — | 0.03 | — | — | — | ○ | X | X | X |
| Comparative Example 4 | Bal. | 30 | 0.5 | 0.03 | — | — | — | X | X | X | X |
| Comparative Example 5 | Bal. | 60 | 0.5 | 0.03 | — | — | — | ○ | X | X | X |
| Comparative Example 6 | Bal. | 40 | 0.2 | 0.03 | — | — | — | ○ | X | X | X |
| Comparative Example 7 | Bal. | 40 | 1.1 | — | — | — | — | X | X | X | X |
| Comparative Example 8 | Bal. | 40 | 1.1 | 0.03 | — | — | — | X | X | X | X |

TABLE 6-continued

| | | | | | | | | | | |
|---|---|---|---|---|---|---|---|---|---|---|
| Comparative Example 9 | Bal. | 40 | 0.5 | 0.004 | — | — | — | ○ | X | X | X |
| Comparative Example 10 | Bal. | 40 | 0.5 | 0.07 | — | — | — | ○ | X | X | X |
| Comparative Example 11 | Bal. | 35 | 0.3 | 0.03 | 0.002 | — | — | ○ | X | X | X |

| | Tensile strength | Elongation | Film thickness of P high-concentration layer | Shear strength (N) Cu plate | Shear strength (N) Electroless Ni/Au plate | Plate exposure rate Ni/Au plate | Comprehensive evaluation |
|---|---|---|---|---|---|---|---|
| Example 111 | ○ | ○ | ○ | ○ | ○ | ○ | ○ |
| Example 112 | ○ | ○ | ○ | ○ | ○ | ○ | ○ |
| Example 113 | ○ | ○ | ○ | ○ | ○ | ○ | ○ |
| Example 114 | ○ | ○ | ○ | ○ | ○ | ○ | ○ |
| Example 115 | ○ | ○ | ○ | ○ | ○ | ○ | ○ |
| Example 116 | ○ | ○ | ○ | ○ | ○ | ○ | ○ |
| Example 117 | ○ | ○ | ○ | ○ | ○ | ○ | ○ |
| Example 118 | ○ | ○ | ○ | ○ | ○ | ○ | ○ |
| Example 119 | ○ | ○ | ○ | ○ | ○ | ○ | ○ |
| Example 120 | ○ | ○ | ○ | ○ | ○ | ○ | ○ |
| Comparative Example 1 | X | ○ | X | X | X | X | X |
| Comparative Example 2 | ○ | ○ | X | X | X | ○ | X |
| Comparative Example 3 | ○ | ○ | X | X | X | X | X |
| Comparative Example 4 | ○ | X | ○ | ○ | ○ | ○ | X |
| Comparative Example 5 | X | X | ○ | ○ | X | X | X |
| Comparative Example 6 | ○ | ○ | X | X | X | X | X |
| Comparative Example 7 | ○ | ○ | ○ | X | X | ○ | X |
| Comparative Example 8 | ○ | X | ○ | ○ | X | ○ | X |
| Comparative Example 9 | ○ | ○ | ○ | X | ○ | ○ | X |
| Comparative Example 10 | ○ | X | ○ | ○ | ○ | ○ | X |
| Comparative Example 11 | ○ | ○ | ○ | ○ | ○ | ○ | X |

The underlines indicate that the numerical values are out of the ranges of the present invention.

TABLE 7

| | Composition (mass %) | | | | | | Melting point (° C.) | As surface concentration | Suppression of thickening paste | Suppression of yellowing during heating solder piece |
|---|---|---|---|---|---|---|---|---|---|---|
| | Sn | Bi | Cu | Ni | As | P | Ge | | | | |
| Comparative Example 12 | Bal. | 35 | 0.5 | 0.03 | 0.002 | — | — | ○ | X | X | X |
| Comparative Example 13 | Bal. | 35 | 0.7 | 0.03 | 0.002 | — | — | ○ | X | X | X |
| Comparative Example 14 | Bal. | 40 | 0.3 | 0.03 | 0.002 | — | — | ○ | X | X | X |
| Comparative Example 15 | Bal. | 40 | 0.5 | 0.03 | 0.002 | — | — | ○ | X | X | X |
| Comparative Example 16 | Bal. | 40 | 0.7 | 0.03 | 0.002 | — | — | ○ | X | X | X |
| Comparative Example 17 | Bal. | 40 | 0.9 | 0.03 | 0.002 | — | — | ○ | X | X | X |
| Comparative Example 18 | Bal. | 45 | 0.3 | 0.03 | 0.002 | — | — | ○ | X | X | X |
| Comparative Example 19 | Bal. | 45 | 0.5 | 0.03 | 0.002 | — | — | ○ | X | X | X |

TABLE 7-continued

| | | | | | | | | | | | |
|---|---|---|---|---|---|---|---|---|---|---|---|
| Comparative Example 20 | Bal. | 45 | 0.7 | 0.03 | <u>0.002</u> | — | — | ○ | X | X | X |
| Comparative Example 21 | Bal. | 58 | 0.3 | 0.03 | <u>0.002</u> | — | — | ○ | X | X | X |
| Comparative Example 22 | Bal. | 58 | 0.5 | 0.03 | <u>0.002</u> | — | — | ○ | X | X | X |
| Comparative Example 23 | Bal. | 58 | 0.7 | 0.03 | <u>0.002</u> | — | — | ○ | X | X | X |
| Comparative Example 24 | Bal. | 58 | 0.5 | 0.01 | <u>0.002</u> | — | — | ○ | X | X | X |
| Comparative Example 25 | Bal. | 58 | 0.5 | 0.06 | <u>0.002</u> | — | — | ○ | X | X | X |
| Comparative Example 26 | Bal. | 35 | 0.3 | 0.03 | 0.004 | — | — | ○ | X | X | X |
| Comparative Example 27 | Bal. | 35 | 0.5 | 0.03 | 0.004 | — | — | ○ | X | X | X |
| Comparative Example 28 | Bal. | 35 | 0.7 | 0.03 | 0.004 | — | — | ○ | X | X | X |
| Comparative Example 29 | Bal. | 40 | 0.3 | 0.03 | 0.004 | — | — | ○ | X | X | X |
| Comparative Example 30 | Bal. | 40 | 0.5 | 0.03 | 0.004 | — | — | ○ | X | X | X |
| Comparative Example 31 | Bal. | 40 | 0.7 | 0.03 | 0.004 | — | — | ○ | X | X | X |
| Comparative Example 32 | Bal. | 45 | 0.3 | 0.03 | 0.004 | — | — | ○ | X | X | X |

| | Tensile strength | Elongation | Film thickness of P high-concentration layer | Shear strength (N) | | Plate exposure rate Ni/Au plate | Comprehensive evaluation |
|---|---|---|---|---|---|---|---|
| | | | | Cu plate | Electroless Ni/Au plate | | |
| Comparative Example 12 | ○ | ○ | ○ | ○ | ○ | ○ | X |
| Comparative Example 13 | ○ | ○ | ○ | ○ | ○ | ○ | X |
| Comparative Example 14 | ○ | ○ | ○ | ○ | ○ | ○ | X |
| Comparative Example 15 | ○ | ○ | ○ | ○ | ○ | ○ | X |
| Comparative Example 16 | ○ | ○ | ○ | ○ | ○ | ○ | X |
| Comparative Example 17 | ○ | ○ | ○ | ○ | ○ | ○ | X |
| Comparative Example 18 | ○ | ○ | ○ | ○ | ○ | ○ | X |
| Comparative Example 19 | ○ | ○ | ○ | ○ | ○ | ○ | X |
| Comparative Example 20 | ○ | ○ | ○ | ○ | ○ | ○ | X |
| Comparative Example 21 | ○ | ○ | ○ | ○ | ○ | ○ | X |
| Comparative Example 22 | ○ | ○ | ○ | ○ | ○ | ○ | X |
| Comparative Example 23 | ○ | ○ | ○ | ○ | ○ | ○ | X |
| Comparative Example 24 | ○ | ○ | ○ | ○ | ○ | ○ | X |
| Comparative Example 25 | ○ | ○ | ○ | ○ | ○ | ○ | X |
| Comparative Example 26 | ○ | ○ | ○ | ○ | ○ | ○ | X |
| Comparative Example 27 | ○ | ○ | ○ | ○ | ○ | ○ | X |
| Comparative Example 28 | ○ | ○ | ○ | ○ | ○ | ○ | X |
| Comparative Example 29 | ○ | ○ | ○ | ○ | ○ | ○ | X |
| Comparative Example 30 | ○ | ○ | ○ | ○ | ○ | ○ | X |
| Comparative Example 31 | ○ | ○ | ○ | ○ | ○ | ○ | X |
| Comparative Example 32 | ○ | ○ | ○ | ○ | ○ | ○ | X |

The underlines indicate that the numerical values are out of the ranges of the present invention.

TABLE 8

| | Composition (mass %) | | | | | | | Melting point (° C.) | As surface concentration | Suppression of thickening paste | Suppression of yellowing during heating solder piece |
|---|---|---|---|---|---|---|---|---|---|---|---|
| | Sn | Bi | Cu | Ni | As | P | Ge | | | | |
| Comparative Example 33 | Bal. | 45 | 0.5 | 0.03 | 0.004 | — | — | ○ | X | X | X |
| Comparative Example 34 | Bal. | 45 | 0.7 | 0.03 | 0.004 | — | — | ○ | X | X | X |
| Comparative Example 35 | Bal. | 58 | 0.3 | 0.03 | 0.004 | — | — | ○ | X | X | X |
| Comparative Example 36 | Bal. | 58 | 0.5 | 0.03 | 0.004 | — | — | ○ | X | X | X |
| Comparative Example 37 | Bal. | 58 | 0.7 | 0.03 | 0.004 | — | — | ○ | X | X | X |
| Comparative Example 38 | Bal. | 58 | 0.5 | 0.01 | 0.004 | — | — | ○ | X | X | X |
| Comparative Example 39 | Bal. | 58 | 0.5 | 0.06 | 0.004 | — | — | ○ | X | X | X |
| Comparative Example 40 | Bal. | 40 | 0.5 | 0.03 | <u>0.05</u> | — | — | ○ | ○ | ○ | ○ |
| Comparative Example 41 | Bal. | 40 | 0.5 | 0.03 | <u>—</u> | — | — | ○ | X | X | X |

| | Tensile strength | Elongation | Film thickness of P high-concentration layer | Shear strength (N) | | Plate exposure rate Ni/Au plate | Comprehensive evaluation |
|---|---|---|---|---|---|---|---|
| | | | | Cu plate | Electroless Ni/Au plate | | |
| Comparative Example 33 | ○ | ○ | ○ | ○ | ○ | ○ | X |
| Comparative Example 34 | ○ | ○ | ○ | ○ | ○ | ○ | X |
| Comparative Example 35 | ○ | ○ | ○ | ○ | ○ | ○ | X |
| Comparative Example 36 | ○ | ○ | ○ | ○ | ○ | ○ | X |
| Comparative Example 37 | ○ | ○ | ○ | ○ | ○ | ○ | X |
| Comparative Example 38 | ○ | ○ | ○ | ○ | ○ | ○ | X |
| Comparative Example 39 | ○ | ○ | ○ | ○ | ○ | ○ | X |
| Comparative Example 40 | ○ | ○ | ○ | X | X | X | X |
| Comparative Example 41 | ○ | ○ | ○ | X | X | X | X |

The underlines indicate that the numerical values are out of the ranges of the present invention.

TABLE 9

| Flux material | Formulation ratio (mass %) |
|---|---|
| Rosin | 42 |
| Glycol-based solvent | 35 |
| Thixotropic agent | 8 |
| Organic acid | 10 |
| Amine | 2 |
| Halogen | 3 |
| Total | 100 |

As shown in Tables 1 to 8, in all of the examples, the melting point was less than or equal to 185° C., the tensile strength was greater than or equal to 70 MPa, the elongation was greater than or equal to 65%, the film thickness of a P-rich layer was less than or equal to 0.014 μm, the shear strength of a solder joint formed using a Cu electrode was greater than or equal to 3.00 N, the shear strength of a solder joint formed using an electroless Ni/Au electrode was greater than or equal to 2.60 N, and the plate exposure rate was 0%. In addition, it was found that not only all of the examples included an As-concentrated layer and the change in viscosity of a solder paste over time was suppressed in the examples but also yellowish discoloration during heating solder pieces was suppressed.

On the other hand, since Comparative Examples 1 to 25 and Comparative Examples 40 to 41 did not satisfy at least one of the requirements of the present invention with all of the alloy compositions, at least one of the evaluation items deteriorated. In addition, since no heat treatment was conducted in Comparative Examples 26 to 39, it was found that it is impossible to check the concentration of As on surfaces, the thickening of the solder pastes was not suppressed, and the solder alloys turned yellow.

Figure 4:
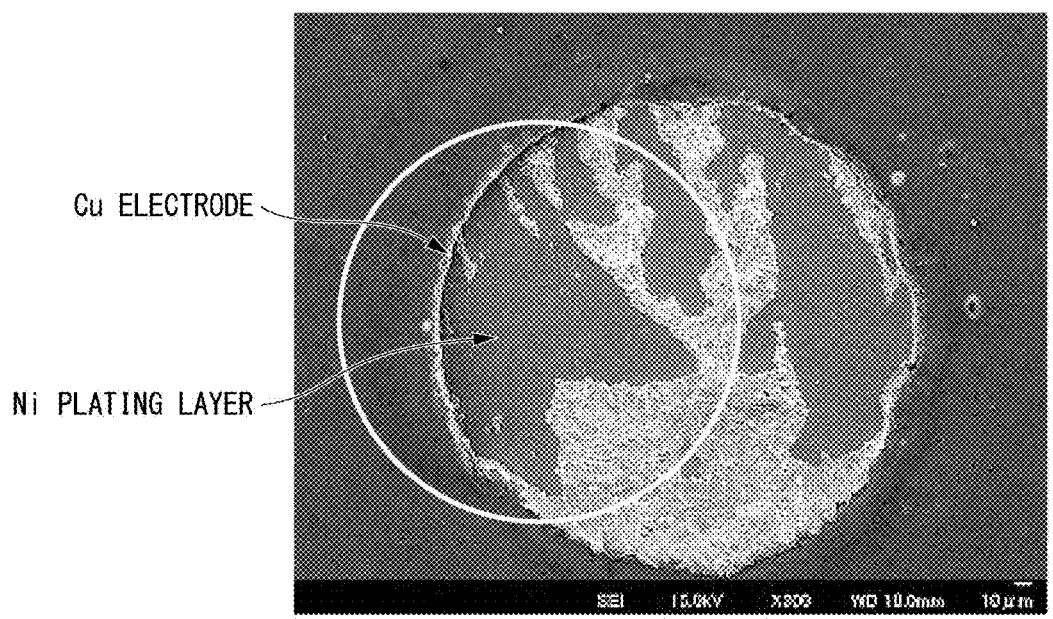
FIG. 4 is a surface photograph of an electrode of magnification of 300 times after soldering is performed on a Cu electrode subjected to an electroless Ni/Au plating treatment using an Sn—58Bi solder alloy and the solder joint portion is removed by shearing.

FIG. 4 is an SEM photograph of a shear surface of an electrode after soldering is performed on an electroless Ni/Au electrode using an Sn—58Bi solder alloy and the solder joint portion is removed by shearing. In Comparative Examples 1, 3, 5, and 6, Ni plating layers were all exposed as shown in FIG. 1. It is thought that this is because a P-rich layer is peeled off at an interface between the P-rich layer and an electroless Ni/Au plating layer due to growth of the P-rich layer.

Figure 5:
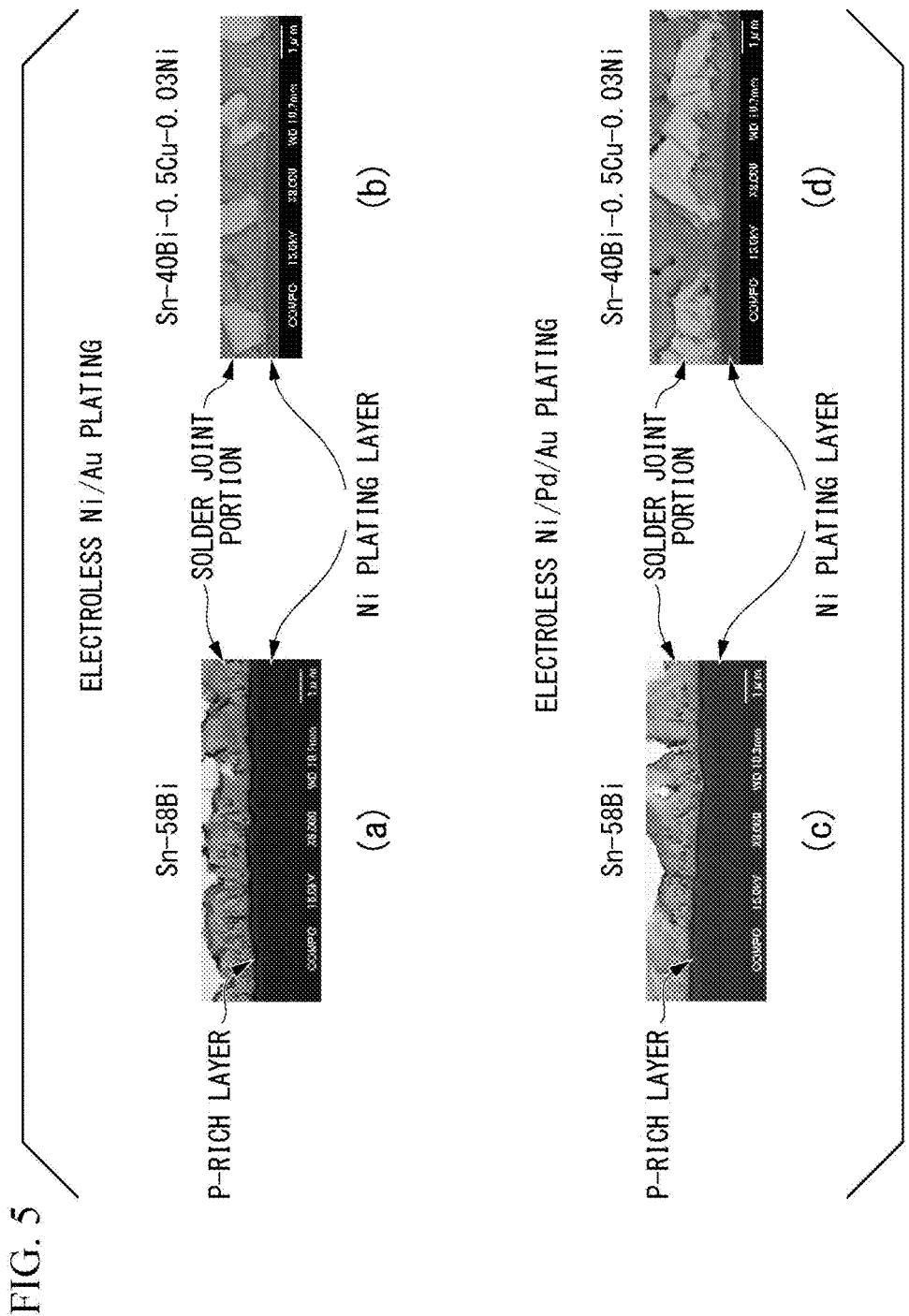
FIGS. 5(a) and 5(b) are cross-sectional photographs of magnification of 800 times near an interface between a solder joint and an electrode in a case where a solder joint is formed through soldering of a Cu electrode subjected to electroless Ni/Au plating treatment.
FIGS. 5(c) and 5(d) are cross-sectional photographs of magnification of 800 times near an interface between a solder joint portion and an electrode in a case where a solder joint is formed through soldering of a Cu electrode subjected to electroless Ni/Pd/Au plating treatment.

FIGS. 5(a) and 5(b) are cross-sectional SEM photographs near an interface between a solder joint portion and an electrode in a solder joint obtained by performing soldering on an electroless Ni/Au electrode, and FIGS. 5(c) and 5(d) are cross-sectional SEM photographs near an interface between a solder connection portion and an electrode in a solder joint obtained by performing soldering on a Cu electrode subjected to electroless Ni/Pd/Au plating treatment. It became clear from FIGS. 5(a) and 5(c) that since Sn—58Bi (Comparative Example 1: the shear strength in the electroless Ni/Au electrode was 2.01 N) did not contain Cu, a P-rich layer had grown. On the other hand, since Sn—40Bi—0.5Cu—0.03Ni of Comparative Example 41 contained a predetermined amount of Cu and Ni, the growth of a P-rich layer was suppressed, and no P-rich layer could be checked from the photographs in FIGS. 5(b) and 5(d). In this manner, according to FIG. 5, it was found that the shear strength significantly improved by suppressing the growth of a P-rich layer.

Figure 6:
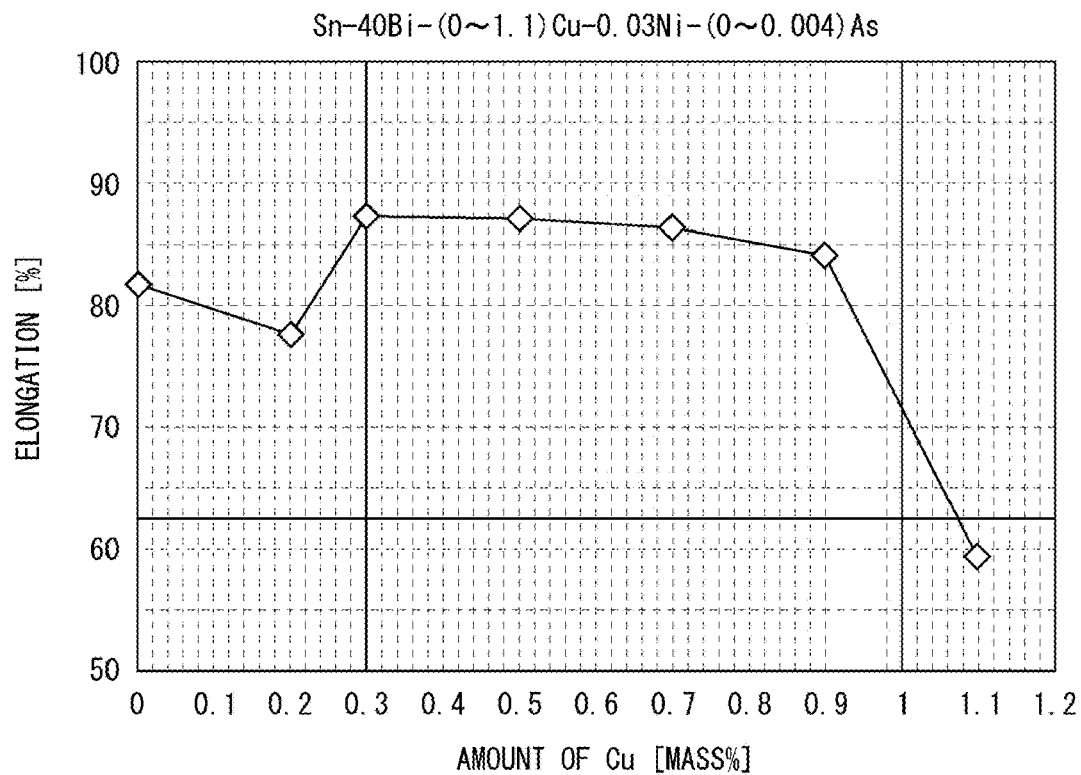
FIG. 6 is a graph showing the relationship between the amount of Cu and the shear strength (Cu electrode) of an Sn—40Bi—(0 to 1.1)Cu—0.03Ni—(0 to 0.004)As solder alloy.
Figure 7:
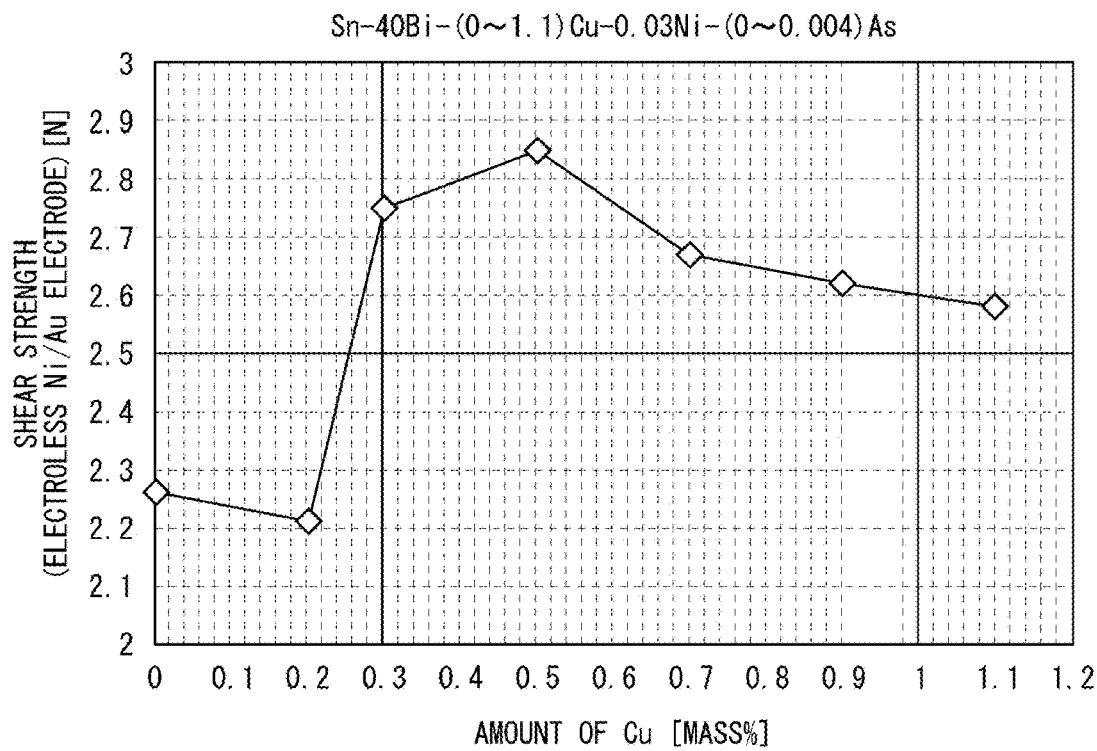
FIG. 7 is a graph showing a relationship between the amount of Cu and the shear strength (electroless Ni/Au electrode) of an Sn—40Bi—(0 to 1.1)Cu—0.03Ni—(0 to 0.004)As solder alloy.
Figure 8:
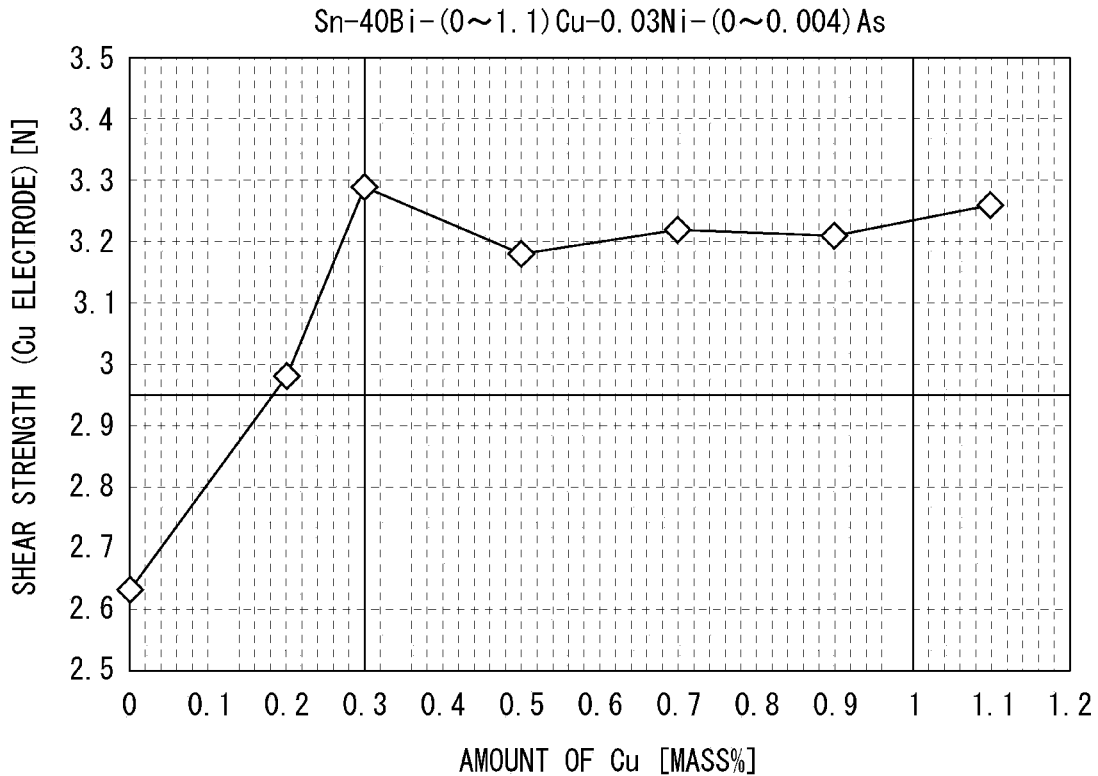
FIG. 8 is a graph showing the relationship between the amount of Cu and the elongation of an Sn—40Bi—(0 to 1.1)Cu—0.03Ni—(0 to 0.004)As solder alloy.

Graphs showing relationships between the contents of Cu and Ni of a solder alloy, a Cu electrode, an electroless Ni/Au electrode, and the elongation are shown in FIGS. 6 to 11 based on the results of Tables 1 to 8. FIG. 6 is a graph showing a relationship between the amount of Cu and the shear strength (Cu electrode) of an Sn—40Bi—(0 to 1.1)Cu—0.03Ni—(0 to 0.004)As solder alloy. FIG. 7 is a graph showing a relationship between the amount of Cu and the shear strength (electroless Ni/Au electrode) of an Sn—40Bi—(0 to 1.1)Cu—0.03Ni—(0 to 0.004)As solder alloy. FIG. 8 is a graph showing a relationship between the amount of Cu and the elongation of an Sn—40Bi—(0 to 1.1)Cu—0.03Ni—(0 to 0.004)As solder alloy. According to FIGS. 6 to 8, it became clear that the range of Cu in which the shear strength of a Cu electrode is greater than or equal to 3.0 N, the shear strength of an Ni electrode is greater than or equal to 2.6 N, and the elongation is greater than or equal to 65% is 0.3% to 1.0%.

Figure 9:
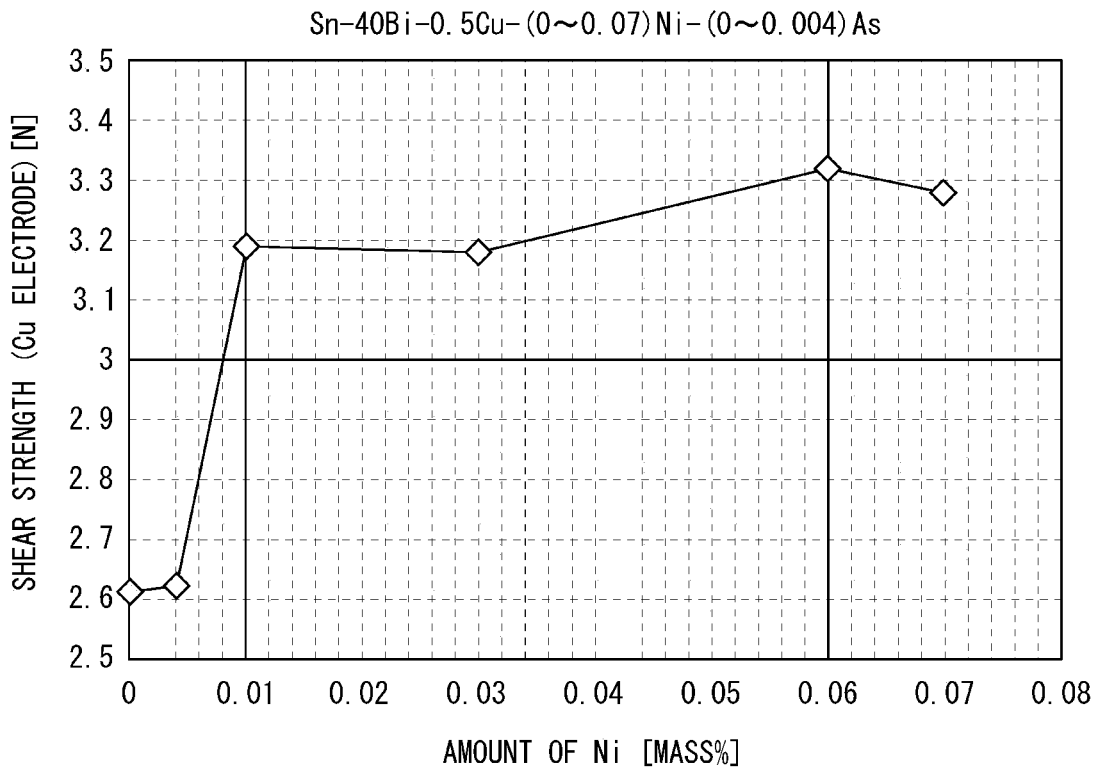
FIG. 9 is a graph showing the relationship between the amount of Cu and the shear strength (Cu electrode) of an Sn—40Bi—0.5Cu—(0 to 0.07)Ni—(0 to 0.004)As solder alloy.
Figure 10:
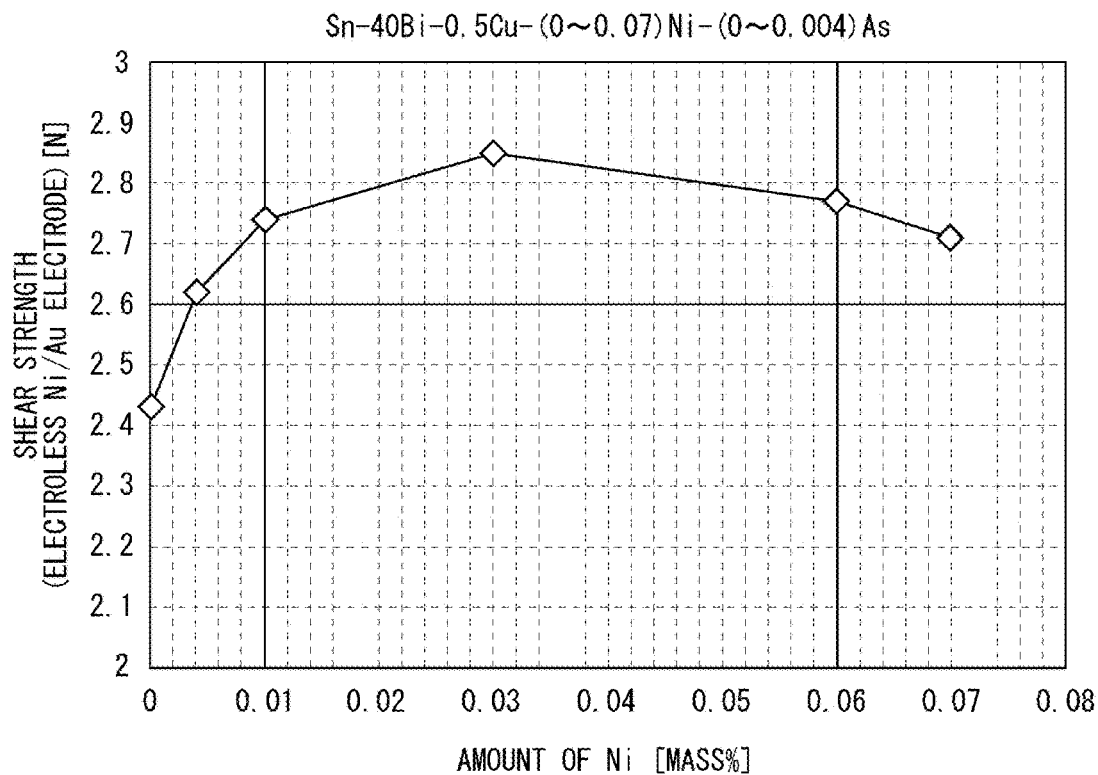
FIG. 10 is a graph showing the relationship between the amount of Cu and the shear strength (electroless Ni/Au electrode) of an Sn—40Bi—0.5Cu—(0 to 0.07)Ni—(0 to 0.004)As solder alloy.
Figure 11:
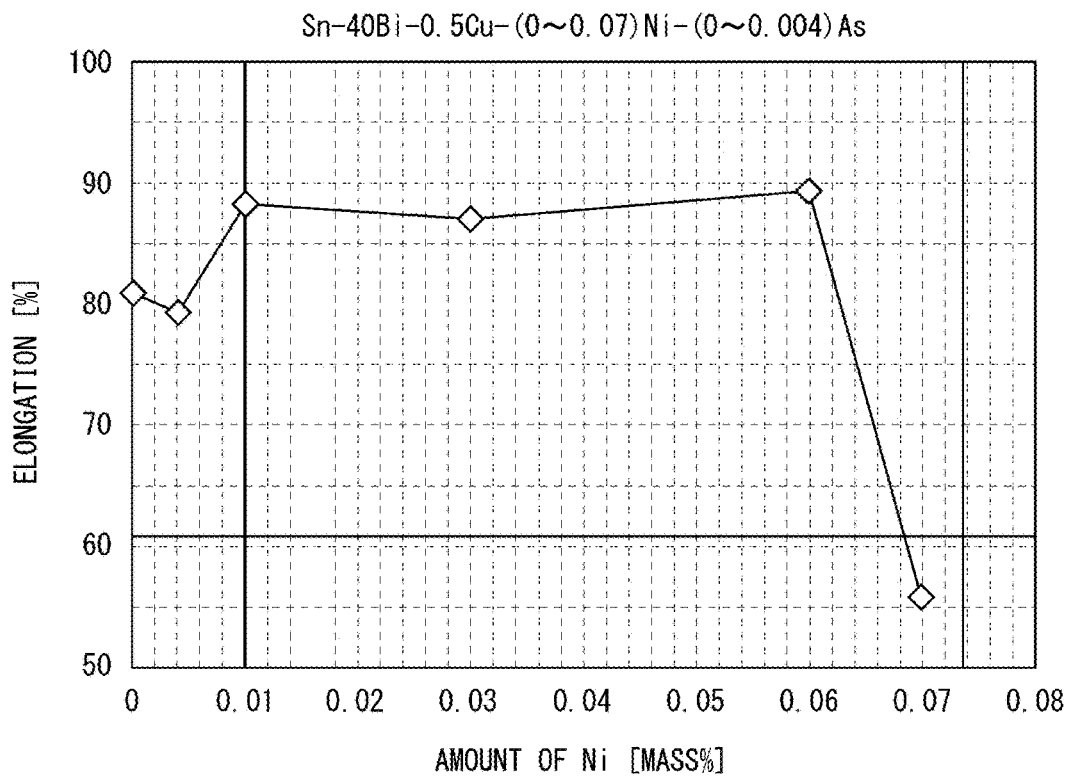
FIG. 11 is a graph showing the relationship between the amount of Cu and the elongation of an Sn—40Bi—0.5Cu—(0 to 0.07)Ni—(0 to 0.004)As solder alloy.

FIG. 9 is a graph showing a relationship between the amount of Cu and the shear strength (Cu electrode) of an Sn—40Bi—0.5Cu—(0 to 0.07)Ni—(0 to 0.004)As solder alloy. FIG. 10 is a graph showing a relationship between the amount of Cu and the shear strength (electroless Ni/Au electrode) of an Sn—40Bi—0.5Cu—(0 to 0.07)Ni—(0 to 0.004)As solder alloy. FIG. 11 is a graph showing a relationship between the amount of Cu and the elongation of an Sn—40Bi—0.5Cu—(0 to 0.07)Ni—(0 to 0.004)As solder alloy. According to FIGS. 9 to 11, it became clear that the range of Cu in which the shear strength of an Cu electrode is greater than or equal to 3.0 N, the shear strength of an Ni electrode is greater than or equal to 2.6 N, and the elongation is greater than or equal to 65% is 0.01% to 0.06%.

What is claimed is:

1. A solder alloy having an alloy composition consisting of, by mass %, 31% to 59% of Bi, 0.3% to 1.0% of Cu, 0.01% to 0.06% of Ni, 0.0040% to less than 0.01% of As, optionally at least one of P and Ge in a total amount of 0.003% to 0.05%, and a balance of Sn, the solder alloy comprising:
   an As-concentrated layer,
   wherein the presence of the As-concentrated layer is confirmed by determination criteria as below,
   wherein the As-concentrated layer is a region from an outermost surface of the solder alloy to a depth of 2×D1 (nm) in terms of $SiO_2$, and
   wherein a thickness of the As-concentrated layer in terms of $SiO_2$ is 0.5 to 8.0 nm,
   wherein the Determination Criteria comprises:
   selecting an arbitrary area of 700 μm×300 μm in three samples, each sample having a size 5.0 mm×5.0 mm;
   performing an XPS analysis in combination with ion sputtering for each of three samples for a total of three analyses, where S1>S2 in all of the three analyses indicates that an As-concentrated layer has been formed, and where
   S1 is Integrated value of a detection intensity of As in a region from a depth of 0 to 2×D1 (nm) in terms of $SiO_2$ in a chart of XPS analysis:
   S2 is Integrated value of a detection intensity of As in a region from a depth of 2×D1 to 4×D1 (nm) in terms of $SiO_2$ in a chart of XPS analysis;
   D1 is Initial depth (nm) in terms of $SiO_2$ at which a detection intensity of O atoms is ½ a maximum detection intensity (intensity at Do·max) in a portion deeper than the depth (Do·max (nm)) in terms of $SiO_2$ at which a detection intensity of O atoms is a maximum in a chart of XPS analysis, and
   the depth in terms of $SiO_2$ is calculated from the sputtering time using a sputter-etching rate of an $SiO_2$ standard sample.

2. A solder paste comprising:
   a solder powder consisting of the solder alloy according to claim 1; and
   a flux.

3. A solder ball consisting of the solder alloy according to claim 1.

4. A solder preform consisting of the solder alloy according to claim 1.

* * * * *